(12) United States Patent
Kurokawa

(10) Patent No.: US 9,588,172 B2
(45) Date of Patent: Mar. 7, 2017

(54) DEVICE INCLUDING TEST CIRCUIT

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 19 days.

(21) Appl. No.: 14/613,560

(22) Filed: Feb. 4, 2015

(65) Prior Publication Data
US 2015/0226791 A1 Aug. 13, 2015

(30) Foreign Application Priority Data
Feb. 7, 2014 (JP) ................. 2014-022542

(51) Int. Cl.
*G01R 31/28* (2006.01)

(52) U.S. Cl.
CPC ..... *G01R 31/2856* (2013.01); *G01R 31/2884* (2013.01)

(58) Field of Classification Search
CPC combination set(s) only.
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,848,075 A * | 12/1998 | Katayama ...... G01R 31/318541 714/726 |
| 6,127,702 A | 10/2000 | Yamazaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51, No. 11; pp. 1805-1810.

(Continued)

*Primary Examiner* — Clayton E Laballe
*Assistant Examiner* — Jas Sanghera
(74) *Attorney, Agent, or Firm* — Fish & Richardson P.C.

(57) ABSTRACT

Provided is a device capable of generating test patterns even after the design stage. The area of a circuit which is included in the device and unnecessary during normal operation can be reduced. The device includes a first circuit and a second circuit. The second circuit includes a plurality of third circuits, a plurality of fourth circuits, and a fifth circuit and has a function of generating a signal for testing operation of the first circuit and a function of operating as part of the first circuit. The fourth circuit has a function of storing a first data and a function of storing a second data. The fifth circuit has a function of writing the first data to the plurality of fourth circuits, a function of writing the second data to the plurality of fourth circuits, and a function of reading the second data from the plurality of fourth circuits.

16 Claims, 25 Drawing Sheets

(56) References Cited

U.S. PATENT DOCUMENTS

| | | |
|---|---|---|
| 6,294,274 B1 | 9/2001 | Kawazoe et al. |
| 6,436,741 B2 | 8/2002 | Sato et al. |
| 6,563,174 B2 | 5/2003 | Kawasaki et al. |
| 6,601,218 B2 | 7/2003 | Sato et al. |
| 6,615,402 B2 | 9/2003 | Kaneko et al. |
| 6,678,645 B1 | 1/2004 | Rajsuman et al. |
| 6,727,522 B1 | 4/2004 | Kawasaki et al. |
| 6,874,107 B2 | 3/2005 | Lesea |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,245,134 B2 | 7/2007 | Granicher et al. |
| 7,282,782 B2 | 10/2007 | Hoffman et al. |
| 7,297,977 B2 | 11/2007 | Hoffman et al. |
| 7,307,433 B2 | 12/2007 | Miller et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,476,927 B2 | 7/2013 | Nishijima |
| 8,547,753 B2 | 10/2013 | Takemura |
| 8,570,065 B2 | 10/2013 | Kobayashi et al. |
| 8,581,610 B2 | 11/2013 | Miller et al. |
| 8,675,382 B2 | 3/2014 | Kurokawa |
| 2001/0046027 A1 | 11/2001 | Tai et al. |
| 2002/0010886 A1 | 1/2002 | Tanaka et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0030056 A1 | 2/2005 | Woo et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2012/0293201 A1 | 11/2012 | Fujita et al. |
| 2013/0207170 A1 | 8/2013 | Kurokawa |
| 2013/0285697 A1 | 10/2013 | Kurokawa |
| 2013/0286757 A1 | 10/2013 | Takemura |
| 2013/0314124 A1 | 11/2013 | Ikeda et al. |
| 2013/0321025 A1 | 12/2013 | Kurokawa et al. |
| 2015/0123684 A1 | 5/2015 | Kurokawa |
| 2015/0131356 A1 | 5/2015 | Kurokawa |
| 2015/0144948 A1 | 5/2015 | Kurokawa |
| 2015/0192641 A1 | 7/2015 | Kurokawa |
| 2015/0207509 A1 | 7/2015 | Kurokawa |
| 2015/0226793 A1 | 8/2015 | Kurokawa |
| 2015/0226802 A1 | 8/2015 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | H05142297 A | 6/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

(56) References Cited

OTHER PUBLICATIONS

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al.,"15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

(56) References Cited

OTHER PUBLICATIONS

Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

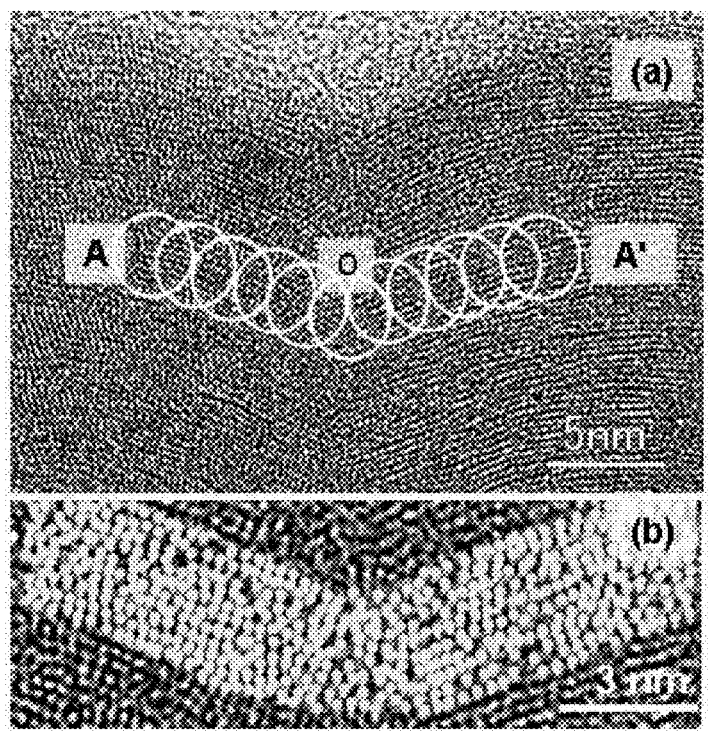
FIG. 24A
FIG. 24B
FIG. 24C
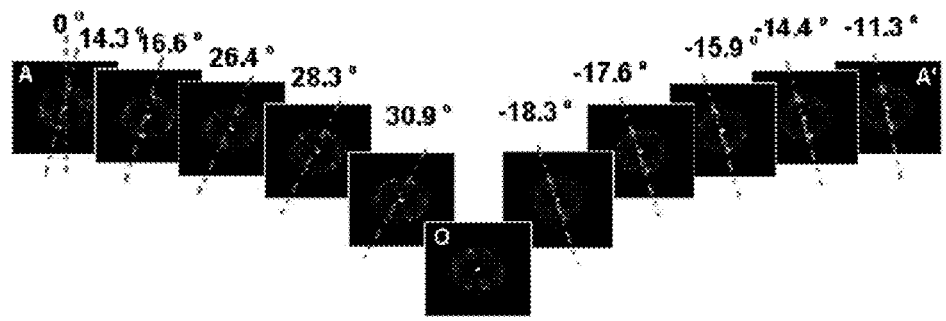

DEVICE INCLUDING TEST CIRCUIT

BACKGROUND OF THE INVENTION

1. Field of the Invention

One embodiment of the present invention relates to a device including a test circuit.

Note that one embodiment of the present invention is not limited to the technical field. The technical field of one embodiment of the present invention disclosed in this specification and the like relates to an object, a method, or a manufacturing method. Another embodiment of the present invention relates to a process, a machine, manufacture, or a composition of matter. Another embodiment of the present invention relates to a semiconductor device, a display device, a lighting device, a power storage device, a memory device, or a driving method or manufacturing method thereof.

2. Description of the Related Art

With a recent increase in circuit size of a device including a processor and the like (hereinafter also referred to as chip), a huge cost of tests in a design stage and a shipping stage of the chip (i.e., chip test) is required.

There are many chip tests; for example, a built-in self-test, BIST is known. BIST is a method using a dedicated circuit (i.e., BIST circuit) which is incorporated in a chip and functions as an LSI tester for a chip test. Examples of the function as an LSI tester include a function of generating a test pattern, a function of supplying the test pattern to a chip as an input signal, a function of obtaining an output signal of a chip, and a function of comparing the output signal with an expected value. Using BIST can make the cost of a chip test lower than that in using only an LSI tester and increase the speed of chip test. Patent Document 1 discloses a technique in which a field-programmable gate array (FPGA) is used for a BIST circuit provided outside an LSI.

REFERENCE

Patent Document

[Patent Document 1] Japanese Published Patent Application No. H5-142297

SUMMARY OF THE INVENTION

To improve the quality of a chip test using a test circuit incorporated in a chip, such as a BIST circuit, or to perform a chip test on a device with complicated functions, test circuits require a wide variety of test patterns. However, as the number and kinds of generated test patterns are increased, the size of the test circuit is increased and thus the area of the test circuit in the device is increased.

In addition, test patterns which can be generated in the chip design stage are fixed. For this reason, when a different test pattern is added after the stage, an additional test pattern needs to be supplied from the outside of the chip such as an LSI tester. In this case, advantages of a chip test using a test circuit incorporated in a chip, such as a higher-speed chip test and lower cost for the chip test, are not sufficiently obtained In view of the technical background, an object of one embodiment of the present invention is to provide a novel device. Another object of one embodiment of the present invention is to provide a device in which the area of a circuit that is unnecessary during normal operation is small. Another object of one embodiment of the present invention is to provide a device capable of generating a new test pattern after the design stage.

One embodiment of the present invention does not necessarily achieve all the objects listed above and only needs to achieve at least one of the objects. The description of the above object does not disturb the existence of other objects. Other objects are apparent from and can be derived from the description of the specification, the drawings, and the claims.

One embodiment of the present invention is a device including a first circuit and a second circuit. The second circuit has a function of generating a signal for testing operation of the first circuit and a function of operating as part of the first circuit.

Another embodiment of the present invention is a device including a first circuit and a second circuit. The second circuit includes a plurality of third circuits, a plurality of fourth circuits, and a fifth circuit and has a function of generating a signal for testing operation of the first circuit and a function of operating as part of the first circuit. The fourth circuit includes a magnetic tunnel junction element and has a function of storing a first data and a function of storing a second data. The fifth circuit has a function of writing the first data to the plurality of fourth circuits, a function of writing the second data to the plurality of fourth circuits, and a function of reading the second data from the plurality of fourth circuits. The first data is to control the conduction between the plurality of third circuits. The second data is used for processing in the first circuit.

In the device according to one embodiment of the present invention, the function of operating as part of the first circuit is a function of operating as a cache memory of the first circuit. The second data is stored in a memory region of the cache memory.

In the device according to one embodiment of the present invention, the first data and the second data may be generated in accordance with serial data input to the fifth circuit and parallel data input to the fifth circuit, respectively.

A novel display device can be provided. One embodiment of the present invention can provide a semiconductor device in which the area of a circuit that is unnecessary during normal operation is small. One embodiment of the present invention can provide a semiconductor device which can generate a new test pattern even after design.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 24A to 24C each illustrate an example of a structure of an oxide semiconductor.

DETAILED DESCRIPTION OF THE INVENTION

Figure 1A:
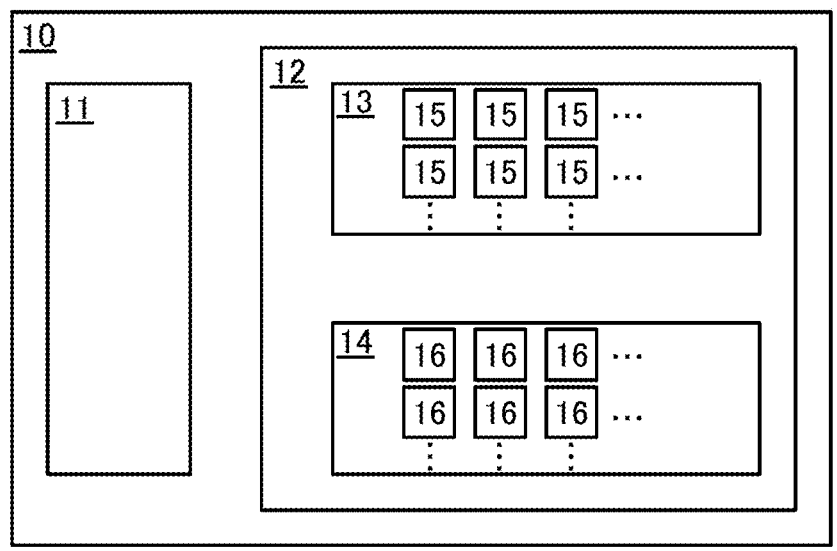
FIGS. 1A and 1B illustrate an example of a structure of a device.

Hereinafter, embodiments of the present invention will be described below in detail with reference to the accompanying drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that one embodiment of the present invention includes, in its category, devices including a semiconductor integrated circuit, for example, a radio frequency tag (an RF tag), a semiconductor display device, an IC, an LSI, a programmable logic device (PLD) such as an FPGA, and a system on a chip (SoC) including an FPGA. The display device includes, in its category, a display device in which an integrated circuit is included in a circuit, such as a liquid crystal display device, a light-emitting device in which a light-emitting element typified by an organic light-emitting element is provided in each pixel, an electronic paper, a digital micromirror device (DMD), a plasma display panel (PDP), a field emission display (FED), and the like.

Note that the term "connection" in this specification refers to not only direct connection but also electrical connection and corresponds to a circuit configuration in which current, voltage, or potential can be supplied or transmitted. Accordingly, a connection circuit means not only direct connection but also indirect connection through an element such as a wiring, a resistor, a diode, or a transistor so that current, voltage, or potential can be supplied or transmitted. In addition, even when different components are connected to each other in a circuit diagram, there is actually a case where one conductive film has functions of a plurality of components, i.e., part of a wiring serves as an electrode, for example. The term "connection" also means such a case where one conductive film has functions of a plurality of components.

A "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Embodiment 1

In this embodiment, a structure example of one embodiment of the present invention is described.

Figure 1B:
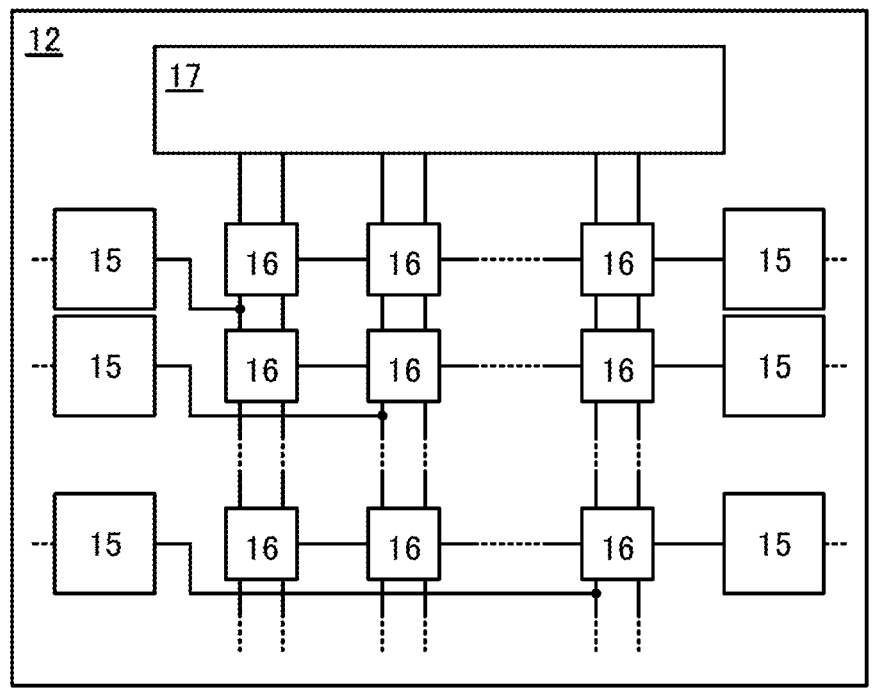

FIGS. 1A and 1B illustrate a structure example of a device according to one embodiment of the present invention. A device 10 in FIG. 1A includes a circuit 11 and a circuit 12. The circuit 11 is a circuit having an arithmetic function, a control function, and the like, typically an integrated circuit including a plurality of transistors. The circuit 11 includes a variety of logic circuits such as a sequential circuit or a combination circuit and can be used as a central processing device. The circuit 12 is typically, like the circuit 11, an integrated circuit including a plurality of transistors, preferably a circuit whose circuit configuration is reconfigurable (hereinafter also referred to as reconfiguration circuit).

The circuit 12 includes a circuit 13 and a circuit 14. The circuit 13 includes a plurality of circuits 15 (hereinafter also referred to as programmable logic element, PLE) functioning as a logic circuit such as a sequential circuit or a combination circuit. The circuit 14 includes a plurality of circuits 16 (hereinafter also referred to as programmable switch, SW) functioning as a switch for controlling the conduction between the plurality of PLE 15 and the conduction between the PLE 15 and an input and output device (not shown). The SW 16 also functions as a circuit (hereinafter also referred to as configuration memory) which stores data (hereinafter, also referred to as configuration data) for determining the conduction between the plurality of PLE 15 and the conduction between the PLE 15 and the input and output device. Configuration data stored in the configuration memory is changed to change the conduction between the plurality of PLE 15 or between the PLE 15 and the input and output device, so that the circuit 12 can be reconfigured to a desired logic circuit.

In addition to the function as a logic circuit, the PLE 15 may have a function of storing configuration data for changing configuration of the logic circuit. The configuration data is changed to change the circuit configuration of the PLE 15, so that the logic of an output signal with respect to an input signal in the PLE 15 can be freely changed. The content of a logic operation in the PLE 15 can be accordingly changed. This provides a function of executing plural kinds of logic operations to each PLE 15, so that the number of PLE 15 can be small and signals generated in the circuit 12 can get varied. In addition, the content of an operation test can be changed without supplying a signal for generating a different test pattern from the outside.

FIG. 1B shows a specific configuration example of the circuit 12. The circuit 12 includes a circuit 17 other than the plurality of PLE 15 and SW 16. The circuit 17 is connected to the plurality of SW 16 and functions as a driver circuit for inputting and outputting data to/from the plurality of SW 16. For example, when configuration data is output from the circuit 17 to the plurality of SW 16, the configuration data can be stored in the SW 16. The conduction of the SW 16 is controlled based on the configuration data to control electrical continuity between the plurality of PLE 15, whereby the circuit 12 can be reconfigured to an intended logic circuit.

In the case where the PLE 15 has a function of storing configuration data for changing configuration of circuits inside the PLE 15, the circuit 17 may have a function of outputting the configuration data to the PLE 15.

The circuit 12 in this embodiment has a function of generating a signal (hereinafter also referred to as test pattern) for an operation test of the circuit 11, i.e., a function as a test circuit of the circuit 11; and a function of driving as part of the circuit 11 when the circuit 11 operates in a normal mode (i.e., a period during which an operation test is not performed), i.e., a function as an extension circuit. These configurations will be described with reference to FIGS. 2A and 2B and FIGS. 3A and 3B. Note that a function of an extension circuit included in the circuit 12 is not limited. For example, processing executed by the circuit 11 may be partly performed by the circuit or other configurations or functions may be added to the circuit 11.

Figure 2A:
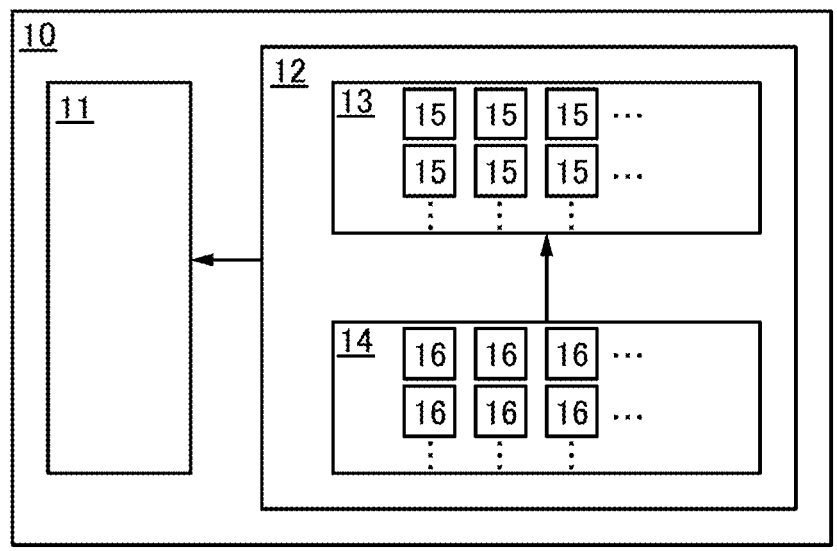
FIGS. 2A and 2B illustrate an example of a structure of a device.
Figure 2B:
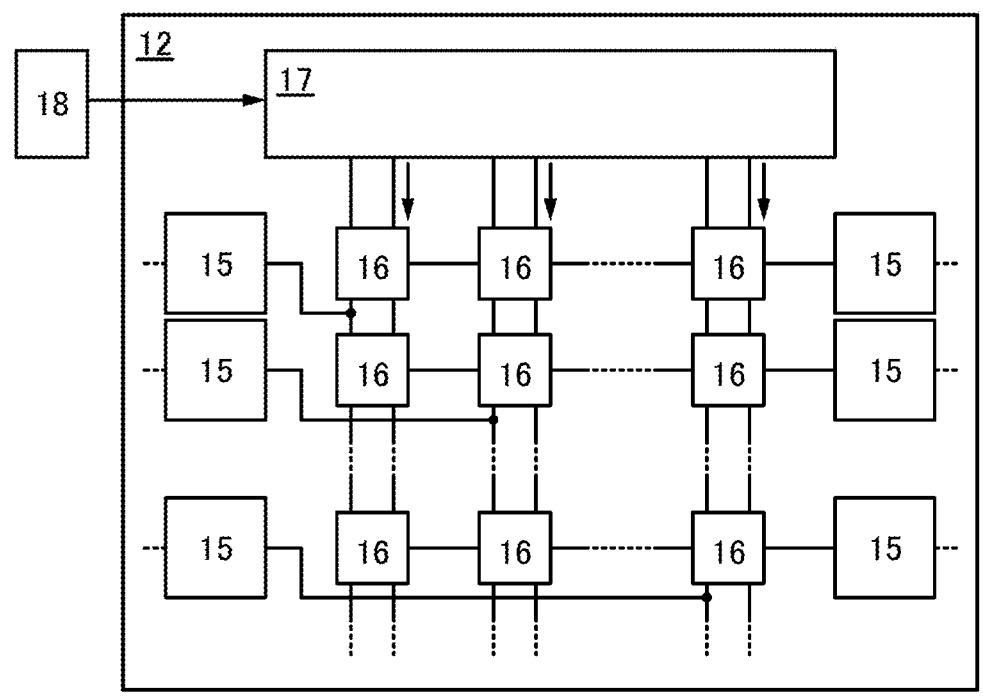

FIGS. 2A and 2B show configurations of the circuit 12 functioning as a test circuit of the circuit 11.

In FIG. 2A, configuration data for operating the circuit 12 as a test circuit is stored in the plurality of SW 16, and the plurality of SW 16 is turned on or off in accordance with the configuration data. The plurality of PLE 15 is accordingly turned on or off, so that the circuit 12 is reconfigured to a test circuit. In other words, a predetermined configuration data is stored in the plurality of SW 16 to provide a function as a test circuit to the circuit 12. The reconfigured circuit 12 generates a test pattern and outputs the test pattern to the circuit 11.

The operation test of the circuit 11 is performed by the input of a test pattern to the circuit 11. The operation test may be performed on either part or whole of the circuit 11. In the case where the circuit 11 includes a memory element, the operation of the memory element may be tested by the operation test (e.g., whether data is appropriately stored). In the case where the circuit 11 includes an analog circuit synchronizing the phase, the operation of the analog circuit may be tested by the operation test.

It is possible that a test for the operating state of the circuit 11 is performed in accordance with a test pattern, and then data corresponding to the test result is transmitted from the circuit 11 to the circuit 12 and the circuit 12 evaluates the operating state of the circuit 11. In this case, the circuit 12 preferably has a function of evaluating the operating state of the circuit 11.

In the case where The circuit 12 functioning as a test circuit as shown in FIG. 2B, the circuit 17 has a function of outputting configuration data to the plurality of SW 16. The configuration data output from the circuit 17 is stored in the plurality of SW 16, whereby the circuit 12 is reconfigured to a test circuit. Note that the configuration data can be output from the circuit 17 to the plurality of SW 16 in such a manner, for example, that serial data corresponding to configuration data is input from the memory device 18 provided outside the circuit 12 to the circuit 17 and then configuration data corresponding to the serial data is output from the circuit 17 to the SW 16. That is, when the circuit 12 serves as a test circuit, the circuit 17 has a function of outputting configuration data to the plurality of SW 16 in accordance with serial data input to the circuit 17.

Figure 3A:
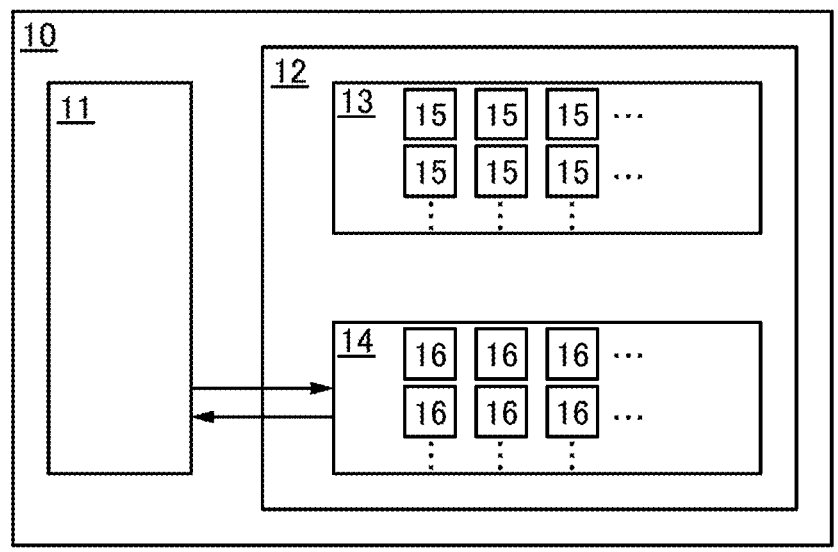
FIGS. 3A and 3B illustrate an example of a structure of a device.
Figure 3B:
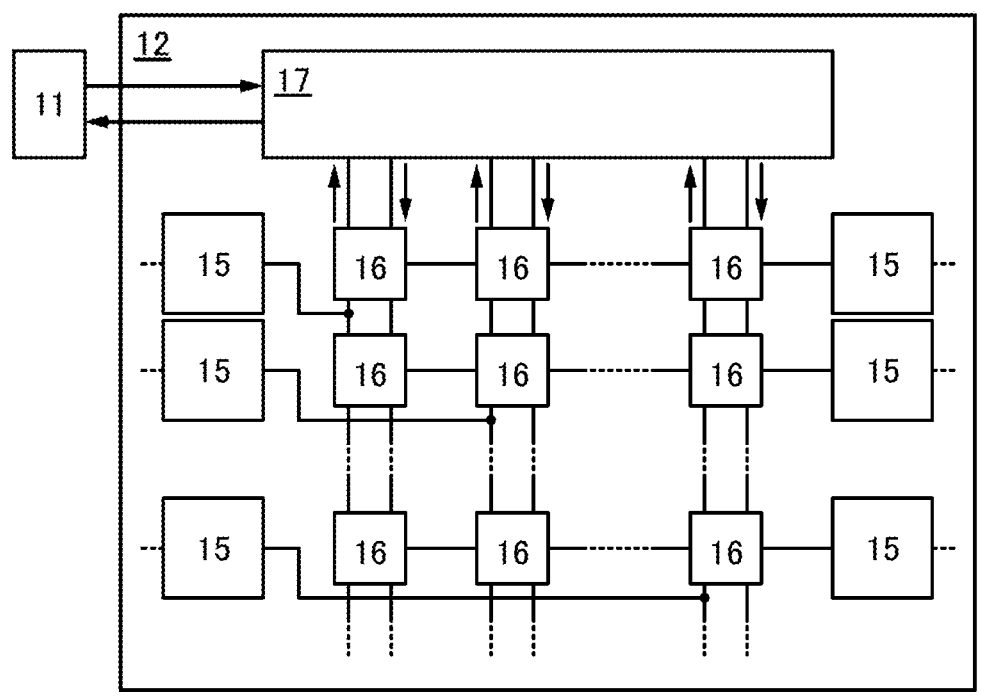

FIGS. 3A and 3B show a configuration of the circuit 12 functioning as an extension circuit of the circuit 11.

When the circuit 11 operates in a normal mode, an operation test of the circuit 11 is not performed and generation of a test pattern in the circuit 12 is unnecessary. For this reason, if the circuit 12 is reconfigured to a test circuit in the normal operation mode of the circuit 11, the area of a circuit unnecessary in the device 10 is increased. In view of this, the circuit 12 is used as an extension circuit in the normal operation of the circuit 11 in one embodiment of the present invention. For example, the SW 16 used as a configuration memory for configuring a test circuit in an operation test of the circuit 11 can serve as a circuit for storing data used for processing in the circuit 11 in the normal operation of the circuit 11, because the SW 16 has a function of storing data. The area of a circuit which is no longer required during normal operation of the circuit 11 in the device 10 can be reduced consequently.

FIG. 3A shows a configuration example in which the SW 16 functions as an extension circuit of the circuit 11. The example here is that the SW 16 serves as a circuit for storing data used for processing in the circuit 11. In the normal operation of the circuit 11, data used for processing in the circuit 11 (e.g., data used in a logic operation in the circuit 11, data obtained by the logic operation in the circuit 11, and data corresponding to the content of the processing in the circuit 11) is output from the circuit 11 to the plurality of SW 16 and stored in the SW 16. The data stored in the SW 16 is output to the circuit 11 according to the instructions from the circuit 11. The SW 16 can be thus used as part of the circuit 11.

In the case where The circuit 12 serving as an extension circuit as shown in FIG. 3B, the circuit 17 has a function of outputting data used for processing in the circuit 11 to the SW 16 and a function of reading the data stored in the SW 16. The SW 16 can be thus used as a memory circuit of the circuit 11. For example, in the case where the SW 16 is used as a cache memory of the circuit 11, data can be written to the SW 16 in such a manner that parallel data corresponding to data stored in a main memory device (not shown) in the device 10 is input from the circuit 11 to the circuit 17, and data corresponding to the parallel data is output from the circuit 17 to the SW 16. To read out the data stored in the SW 16, the data is input to the circuit 17 and output from the circuit 17 to the circuit 11. In other words, when the circuit 12 serves as an extension circuit, the circuit 17 has a function of outputting data used for processing in the circuit 11 to the plurality of SW 16 in accordance with parallel data input from the circuit 11 and a function of reading data stored in the plurality of SW 16 as parallel data.

Note that function switching of the circuit 12 between a function as a test circuit and a function as an extension circuit can be made by input of a control signal from an input and output device (not shown) or the like to the circuit 12. Alternatively, the function switching may be performed when the device 10 is turned on in accordance with instructions that is stored in a memory device (not shown) included in the circuit 11. In the case where the circuit 12 is used as an extension circuit, the output impedance of the plurality of PLE 15 is made high to disrupt signals from the PLE 15 to the SW 16, and the SW 16 can be independent of the PLE 15.

Figure 4:
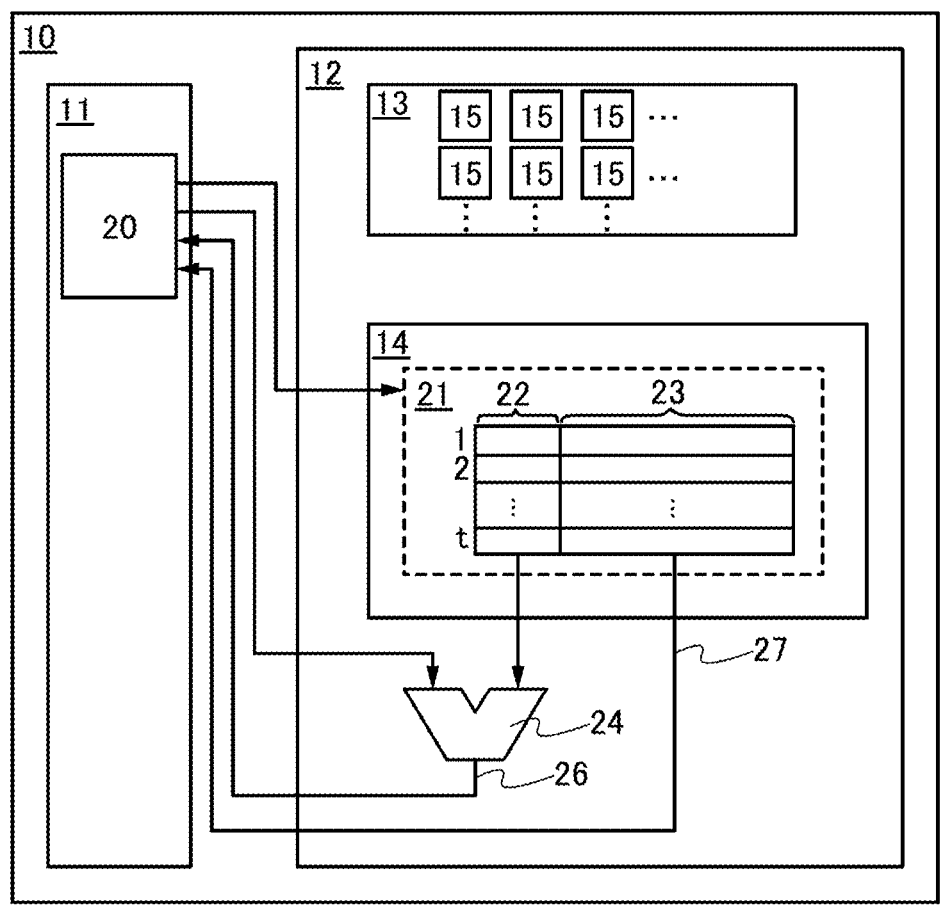
FIG. 4 illustrates an example of a structure of a device.
Figure 5:
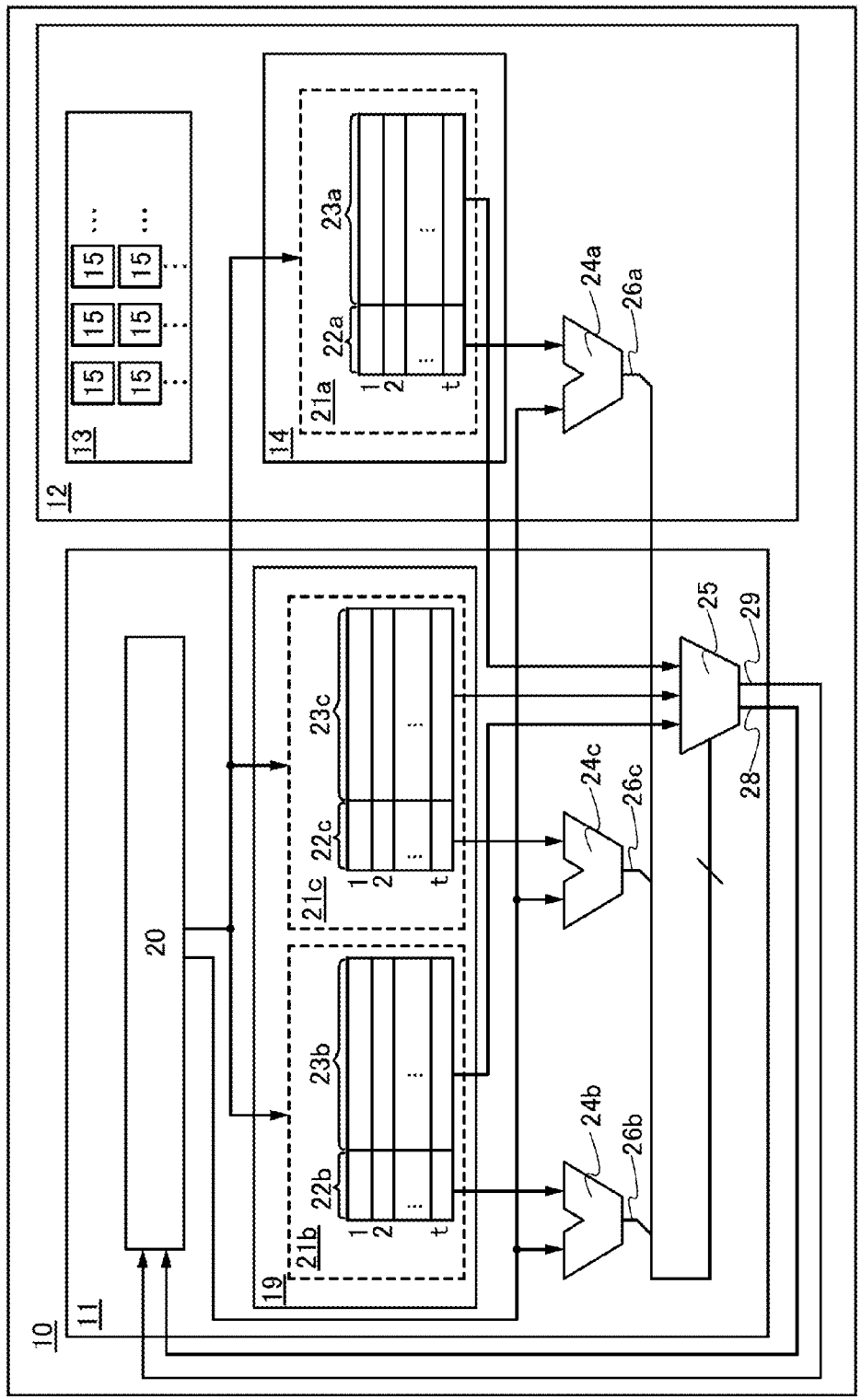
FIG. 5 illustrates an example of a structure of a device.

FIGS. 4 and 5 illustrate a configuration example where the circuit 12 is used as a memory circuit of the circuit 11, specifically a cache memory when the circuit 11 is in normal operation.

First, to test the operating state of the circuit 11, the circuit 12 is reconfigured to a test circuit as shown in FIGS. 2A and 2B on the basis of configuration data stored in the plurality of SW 16. Then, a test pattern is generated in the circuit 12 and output to the circuit 11.

In contrast, while the circuit 11 operates normally, the circuit 14 including the plurality of SW 16 has a function of the cache memory of the circuit 11 as illustrated in FIG. 4. Specifically, at least part of the plurality of SW 16 serves as a memory region 21 of the cache memory.

The memory region 21 includes a plurality of memory regions (hereinafter referred to as lines) capable of storing a predetermined amount of data. Each line can store a copy of part of data stored in a main memory device (not shown) in the device 10. FIG. 4 shows an example in which the memory region 21 includes lines in t rows (t is a natural number). Each line in the memory region 21 includes a tag field 22 and a data field 23. The data field 23 corresponds to a memory region for storing a copy of part of data stored in a main memory device. The tag field 22 corresponds to a memory region for storing a high-order bit of the address (i.e., tag data) of the main memory device that corresponds to data stored in the data field 23. Which line in the data field 23 to store a copy of data of the main memory device is determined depending on a low-order bit of the address of the main memory device corresponding to the data stored in the data field 23.

The circuit 12 includes a comparator circuit 24. The comparator circuit 24 has a function of comparing a high-order bit of an address to which access is requested by a processor 20 included in the circuit 11 with tag data stored in the tag field 22 of a line specified by a low-order bit of the address and outputting the comparison result as a tag hit signal. This comparison can determine whether data corresponding to the address to which access is requested by the processor 20 is stored in the memory region 21 (cache hit) or not (cache miss). When a cache hit occurs, data stored in the data field of a corresponding line is used as intended data in processing of the circuit 11.

Next, an operation example of the circuit 12 used as a cache memory is described.

When there is a request for access to a given address from the processor 20, a low-order bit of the address is transmitted to the memory region 21 and a high-order bit of the address is transmitted to the comparator circuit 24. Then, in the memory region 21, tag data stored in the tag field 22 of a line specified by the low-order bit of the address received from the processor 20 is read out and transmitted to the comparator circuit 24.

The comparator circuit 24 compares the high-order bit of the address to which access is requested by the processor 20 and the tag data read from the tag field 22. When the comparison result indicates that the high-order bit of the address and the tag data match, it means that data corresponding to the address to which access is requested by the processor 20 is stored in the memory region 21. In contrast, when the comparison result indicates that the high-order bit of the address and the tag data do not match, it means that data corresponding to the address to which access is requested by the processor 20 is not stored in the memory region 21. Then, the comparison result is output as the signal 26 from the comparator circuit 24 to the processor 20. When the comparison result indicates that the high-order bit of the address and the tag data match, it means that data stored in the data field 23 specified by the low-order bit of the address corresponds to intended data used in the processor 20. The data is thus output as a signal 27 to the processor 20.

Although not illustrated in FIG. 4, in each line of the memory region 21, identification data on the validity of the data stored in the data field of the line is stored in a specific memory region. A state where the data is invalid is determined as a cache miss regardless of comparison results of the tag.

Without limitation to the example in FIG. 4 in which the comparator circuit 24 is provided outside the circuits 13 and 14, another structure in which the circuit 13 serves as the comparator circuit 24 is possible. In this structure, data for reconfiguring the circuit 13 to a circuit serving as the comparator circuit 24 is stored in part of the circuit 14. Another structure in which part of the circuit 14 serves as the comparator circuit 24 is possible.

In the above manner, the circuit 14 can be used as a cache memory while the circuit 11 is in normal operation. The cache memory can be a fully associative cache, a direct mapped cache, or a set associative cache.

FIG. 5 shows a structure example in which the circuit 12 is used as part of a set associative cache memory. The circuit 11 in FIG. 5 includes a circuit 19. The circuit 14 includes a memory region 21a including a tag field 22a and a tag field 23a. The circuit 19 includes a memory region 21b including a tag field 22b and a data field 23b and a memory region 21c including a tag field 22c and a data field 23c. In this structure, each of the circuits 19 and 14 can be used as a cache memory. This structure provides a set associative cache memory using the memory region 21a in the circuit 14 and the memory regions 21b and 21c in the circuit 19. Note that the memory region 21a, the tag field 22a, the data field 23a, the comparator circuit 24, and the signal 26a correspond to the memory region 21, the tag field 22, the data field 23, the comparator 24a, and the signal 26 in FIG. 4, respectively.

The circuit 11 further includes comparator circuits 24b and 24c. The comparator circuit 24b compares high-order bits of an address access-requested by the processor 20 and tag data stored in the tag field 22b of the line determined by low-order bits of the address and outputs the comparison results as the signal 26b. The comparator circuit 24c compares high-order bits of an address access-requested by the processor 20 and tag data stored in the tag field 22c of the line determined by low-order bits of the address and outputs the comparison results as the signal 26c. Note that the comparator circuits 24b and 24c may be provided in the circuit 12 like the comparator circuit 24a. Furthermore, the circuit 13 or 14 may serve as the comparator circuit 24b or 24c.

The circuit 11 further includes a selection circuit 25. The selection circuit 25 outputs signals containing data of comparison results obtained by the comparators 24a, 24b, and 24c. Specifically, in the case where a line to which the high-order bit of the access-requested address corresponds is found as a result of the comparison by the plurality of comparator circuits 24a, 24b, and 24c, the selection circuit 25 selects the data read out from the line and outputs it as a signal 28. That is, in the case where the comparison results by the comparator circuit 24a shows that the high-order bit of the address corresponds to tag data, the data stored in the data field 23a of the line determined by the low-order bit of the address is output to the processor 20 as the signal 28. When the comparison result in the comparator circuit 24b indicates that the high-order bit of the address and the tag data match, data stored in the data field 23b of the line determined by the low-order bit of the address is output as the signal 28 to the processor 20. When the comparison result in the comparator circuit 24c indicates that the high-order bit of the address and the tag data match, data stored in the data field 23b of the line determined by the low-order bit of the address is output as the signal 28 to the processor 20. In addition, the selection circuit 25 determines whether data access-requested by the processor 20 is stored in the circuit 19 or 14 (cache hit) or not (cache miss) in accordance with results produced by the plurality of comparators 24a to 24c and outputs the results as a signal 29 to the processor 20. The signal 28 containing the results of comparison in the comparator circuits 24a, 24b, and 24c as information can also be generated by a circuit other than the selection circuit 25, for example, an OR circuit. Note that the selection circuit 25 may be included in the circuit 12.

In the example of FIG. 5, the circuit 19 includes a pair of memory regions (the memory regions 21b and 21c) and the circuit 14 includes a memory region (the memory region 21a). With the memory regions 21a to 21c, a three-way set associative cache memory can be configured. Note that the number of memory regions in the circuits 19 and 14 is not limited thereto and can be arbitrarily determined. With the circuits 19 and 14, an (i+j)-way set associative cache memory can be configured (i is the number of sets included in the circuit 19; j is the number of sets included in the circuit 14). The cache memory using the circuits 19 and 14 can have a larger number of cache memory sets than a cache memory using one of the circuits 19 and 14. Thrashing of the device 10 thus becomes less likely to occur and the hit rate of the cache memory can be increased. The performance of the device 10 can be increased as a result.

Alternatively, when the circuit 12 functions as a test circuit, the circuit 19 can function as an i-way set associative cache memory. When the circuit 19 functions as an extension circuit, the circuits 19 and 14 can function as an (i+j)-way set associative cache memory.

In the device of one embodiment of the present invention, when the circuit 12 serves as a test circuit, the circuit 17 outputs configuration data to the plurality of SW 16 (FIG. 2B); and when the circuit 11 performs normal operation, the circuit 17 outputs data used for processing in the circuit 11 to the plurality of SW 16 and read the data stored in the SW 16 (FIG. 3B). This is why the circuit 12 can serve as a test circuit and an extension circuit. Thus, the circuit 12 used as a test circuit for testing operation of the circuit 11 can also serve as an extension circuit for a cache memory or the like when the circuit 11 performs normal operation. The area of a circuit that is unnecessary during normal operation of the circuit 11 can be reduced in the device 10.

Note that one embodiment of the present invention is not limited to the example in this embodiment in which a test circuit is unnecessary during normal operation of the circuit 11. That is, an arbitrary circuit that is unnecessary during normal operation of the circuit 11 can be reconfigured by the circuit 12. Also in that case, the area of a circuit that is unnecessary during normal operation can be reduced.

Note that one embodiment of the present invention is not limited to the example in this embodiment in which a cache memory is used as an extension circuit. For example, the circuit 12 may be used as a translation look-aside buffer (TLB) in a virtual memory or a branch prediction circuit. The circuit 12 may be used as an arithmetic operation circuit such as a multiple circuit or a product-sum operation circuit. Furthermore, when a function as a cache memory and a function as an arithmetic circuit are switched in the circuit 12 during normal operation of the circuit 11, the circuit 12 can be used as both a cache memory and an arithmetic circuit.

Note that the description of this embodiment can be combined with description disclosed in this specification and the like, such as another description disclosed in this embodiment and the description of any of the other embodiments, as appropriate.

Embodiment 2

In this embodiment, a specific configuration example of the circuit 12 in FIGS. 1A and 1B to FIGS. 3A and 3B is described.

Figure 6:
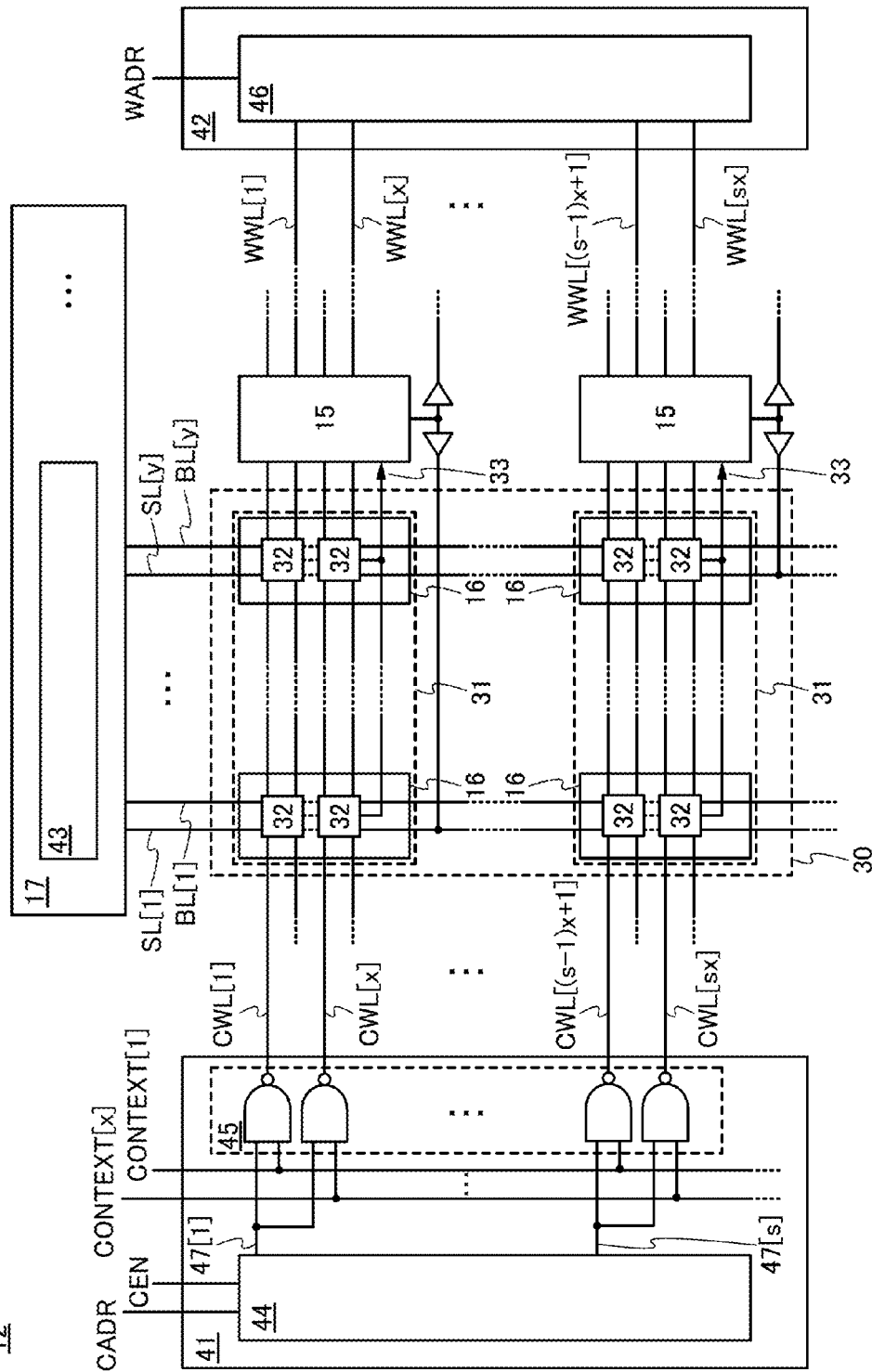
FIG. 6 illustrates an example of a structure of a device.

FIG. 6 shows an example of a configuration of the circuit 12. The circuit 12 includes a cell array 30 including the plurality of PLE 15 and the plurality of SW 16, the circuit 17, a circuit 41, and a circuit 42. Note that the plurality of SW 16 is each connected to the circuits 17, 41, and 42. The plurality of PLE 15 is each connected to at least one of the SW 16.

The SW 16 includes cells 32 in x rows, and the cell array 31 includes the SW 16 in y columns. A cell array 30 includes cell arrays 31 in s rows and thus includes (sxxy) cells 32. Each of the cells 32 stores data output from the circuit 17.

In the case where the circuit 12 is used as a test circuit, configuration data is output from the circuit 17 and stored in the cell 32. The conduction of the cell 32 is controlled in accordance with the configuration data, and the circuit configuration of the cell array 31 is accordingly determined and a specific signal 33 is input from the cell array 31 to the PLE 15. In accordance with the signal 33, an output signal of the PLE 15 is determined and input to SW, PLE, and the like.

In the case where the circuit 12 is used as an extension circuit, particularly a memory circuit, data used for processing in the circuit 11 is output from the circuit 17 and stored in the cell 32 via a wiring BL. A signal corresponding to the data stored in the cell 32 is output to the circuit 17 via a wiring SL, i.e., data is read out. The cell array 30 can store sx sets of y-bits data.

Figure 7:
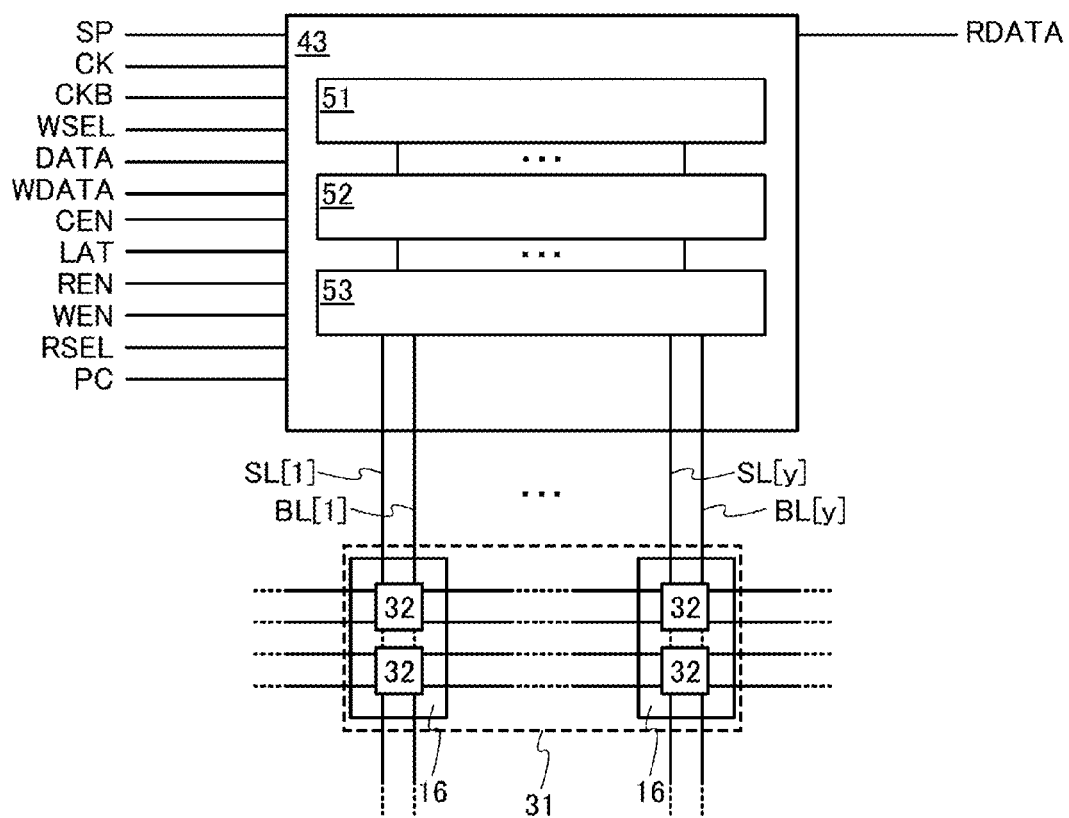
FIG. 7 illustrates an example of a structure of a device.

The circuit 17 has functions similar to those of the circuit 17 in FIGS. 1A and 1B to FIGS. 3A and 3B; the circuit 17 outputs data to the cells 32, read data stored in the cells 32, and outputs the data to the outside. The circuit 17 includes a circuit 43. The circuit 43 includes circuits 51, 52, and 53 as shown in FIG. 7. Note that the circuit 17 may include the plurality of the circuits 43.

In the case where the circuit 12 is used as a test circuit or an extension circuit, the circuit 51 sequentially stores serial data that is supplied from a wiring DATA to the circuit 53 via the circuit 52 in accordance with a start pulse supplied from a wiring SP, a clock signal from a wiring CK, and an inverted clock signal from a wiring CKB. (Hereinafter, the circuit 51 is also referred to as shift register 51). Note that one of the examples of serial data supplied from the wiring DATA is configuration data for reconfiguring the circuit 12 to a test circuit.

In the case where the circuit 12 is used as an extension circuit, particularly a memory circuit, the circuit 52 stores multi-bit parallel data supplied from a wiring WDATA to a predetermined node of the circuit 53 that is determined by a signal supplied from a wiring WSEL. Hereinafter, the circuit 52 is also referred to as selection circuit 52. Note that one of the examples of parallel data of a plurality of data supplied from the wiring WDATA is a copy of part of data stored in a main memory device.

The circuit 53 outputs data stored in the circuit 53 all together to the wiring BL in accordance with a signal supplied from a wiring LAT. Furthermore, the circuit 53 stores data output from the cells 32. Hereinafter, the circuit 53 is also referred to as line buffer 53.

The circuit 43 is preferably configured to precharge the wiring SL with a signal supplied from a wiring PC. The circuit 43 is preferably configured to find data specified by a signal supplied from a wiring RSEL from data output from the cell 32 and stored in the line buffer 53 and to output the data to a wiring RDATA.

Note that whether the circuit 12 is used as a test circuit is determined by a signal supplied from a wiring CEN. The operation of reading data from the cell 32 is controlled by a signal supplied from a wiring REN. The operation of writing data to the cell 32 is controlled by a signal supplied from a wiring WEN.

The circuit 41 in FIG. 6 controls potentials of wirings CWL[1] to [sx] to select the cells 32 in a specific row from the plurality of cells 32 included in the cell array 30.

The circuit 41 further includes a circuit 44 and a circuit 45. The circuit 44 generates a signal for selecting the SW 16 in a specific row from the SW 16 of s rows included in the cell array 30. The circuit 45 generates a signal for selecting the cells 32 in a more specific row in the SW 16 in the specific row selected by the circuit 44 using a signal supplied to a wiring CONTEXT[1] to [x]. Note that the circuit 44 can be configured using a decoder, for example. The circuit 45 can be configured using a plurality of AND circuits, for example.

When the circuit 12 is used as a test circuit, the circuit 44 outputs a signal for selecting all the SW 16 in s rows to wirings 47[1] to [s]. The circuit 45 outputs a signal for selecting the cells 32 in one specific row in each SW 16 to the wirings CWL[1] to [sx] in accordance with the signal input from the circuit 44 through the wirings 47[1] to [s] and the signal input through the wirings CONTEXT[1] to [x]. Specifically, the circuit 45 outputs a signal for selecting a set of rows from among a set of the first-row wirings CWL[1] to [(s−1)x+1] to a set of the x-th-row wirings CWL[x] to [sx]. Then, the circuit 12 is reconfigured to a desired test circuit in accordance with the configuration data stored in the cell 32 connected to the wiring CWL which is selected by the circuit 41.

In the case where the circuit 12 is used as an extension circuit, the circuit 44 outputs a signal for selecting the SW 16 in one specific row from s rows to the wirings 47[1] to [s] in accordance with the signal supplied to a wiring CADR. The circuit 45 outputs a signal for selecting cells 32 in one specific row from the cells 32 included in the SW 16 selected by the circuit 44 to the wirings CWL[1] to [sx] in accordance with the signal input from the circuit 44 through the wirings 47[1] to [s] and the signal input from the circuit 44 through the wirings CONTEXT[1] to [x]. Specifically, the circuit 45 outputs a signal for selecting one from the wirings CWL[1] to [sx]. Then, signals corresponding to data stored in the cells 32 in the row selected by the circuit 41 are output to the wirings SL[1] to [y].

In other words, when the circuit 12 is used as a test circuit, the circuit 41 has a function of selecting cells 32 in one specific row from among x rows in each SW 16; when the circuit 12 is used as an extension circuit, the circuit 41 has a function of selecting cells 32 in one specific row from among sx rows.

The circuit 42 controls the potentials of wirings WWL[1] to [sx] to select cells 32 in one specific row from among a plurality of cells 32 included in the cell array 30. Specifically, the circuit 42 includes a circuit 46 that outputs a signal for selecting cells 32 in one specific row from among sx rows to the wirings WWL[1] to [sx]. The circuit 46 can be configured using a decoder, for example. A signal containing data related to an address of a selected row is supplied from a wiring WADR to the circuit 46. The circuit 46 decodes the signal to select cells in one specific row to which the data is input. The cells 32 in the selected row store data supplied from wirings BL[1] to [y].

With this structure, the circuit 17 can write serial data corresponding to configuration data for reconfiguring the circuit 12 to a test circuit, write parallel data corresponding to a copy of part of data stored in the main memory device, and read the parallel data. The circuit 12 can be thus provided functions as a test circuit and an extension circuit.

Figures 8A, 8B:
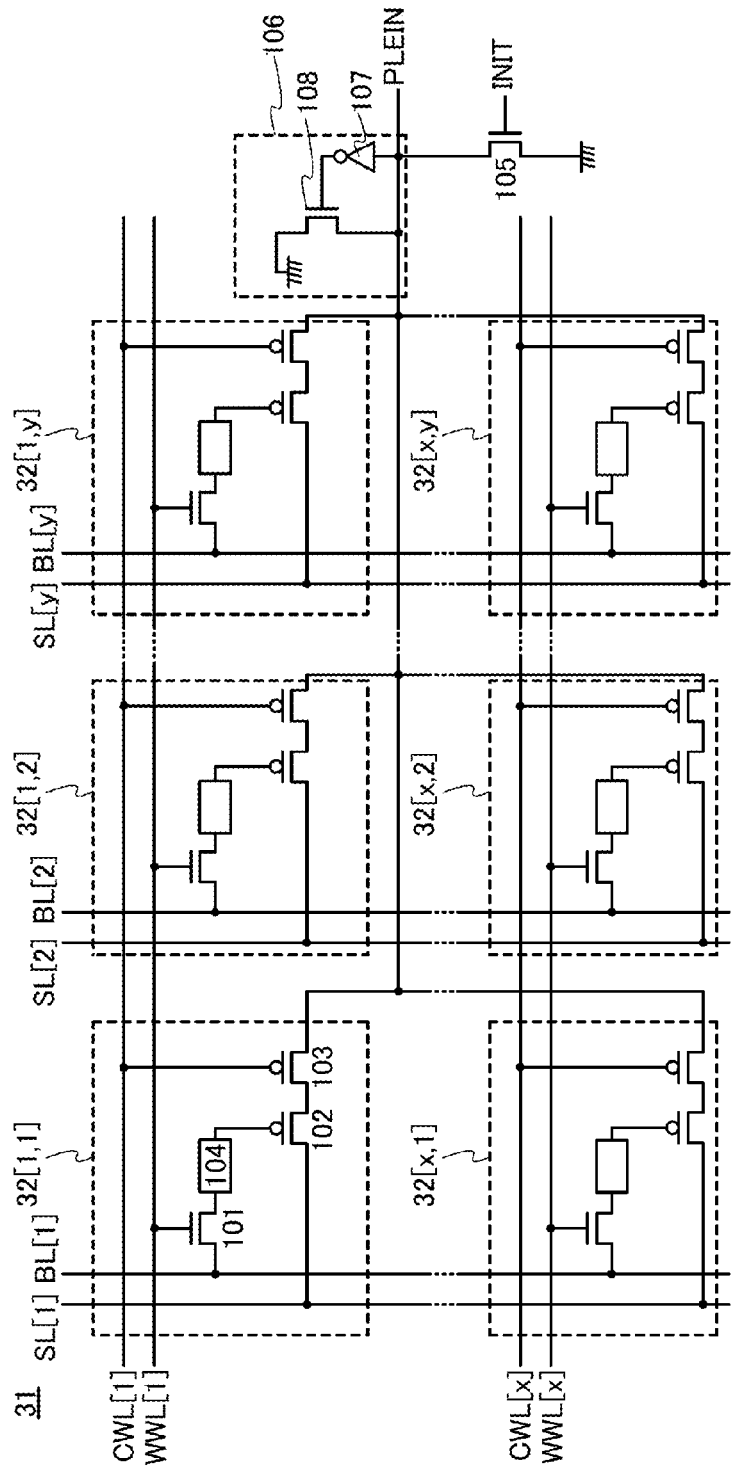
FIGS. 8A and 8B are circuit diagrams illustrating examples of a structure of a device.

Next, an example of a specific configuration of the cell array 31 in FIG. 6 is shown in FIG. 8A. The cell array 31 includes the plurality of cells 32. The cells described here are arranged in x rows and y columns. Note that a cell in the x-th row and the y-th column is represented by a cell 32 [x, y] in FIG. 8A.

The cells 32[1,1] to [x,y] each includes a transistor 101, a transistor 102, a transistor 103, and a memory circuit 104 for storing data. A gate of the transistor 101 is connected to a wiring WWL. One of a source and drain of the transistor 101 is connected to the wiring BL, and the other thereof is connected to a first terminal of the memory circuit 104. A second terminal of the memory circuit 104 is connected to the other of the source and drain of the transistor 101 and a gate of the transistor 102. One of a source and drain of the transistor 102 is connected to the wiring SL, and the other thereof is connected to one of a source and drain of the transistor 103. A gate and the other of the source and drain of the transistor 103 are connected to the wiring CWL and the wiring PLEIN, respectively.

The wirings CWL[1] to [x] each has a function of transmitting a signal for selecting cells 32 in a specific row from among a plurality of cells 32, i.e., a function of transmitting a signal for controlling conduction of transistors 103. The wirings WWL[1] to [x] each has a function of transmitting a signal for selecting cells 32 in a specific row from among a plurality of cells 32, i.e., a function of transmitting a signal for controlling conduction of transistors 103. The wirings BL[1] to [y] each has a function of transmitting a signal corresponding to data to be stored in the cells 32. The wirings SL[1] to [y] each has a function of transmitting a signal corresponding to data that is stored in the cells 32. The wiring PLEIN has a function of transmitting a signal to be input to or output from a PLE or an input and output device.

The cell array 31 may include a transistor 105. A gate of the transistor 105 is connected to a wiring NIT. One of a source and drain of the transistor 105 and the other thereof are connected to the wiring PLEIN and a wiring to which a predetermined potential is supplied, respectively. Note that the level of the predetermined potential is not limited to 0 volts. In an initial state just after a power supply voltage is supplied to a device including the cell array 31, the potential of the wiring PLEIN becomes sometimes the intermediate potential between a high level and a low level. When the intermediate potential is applied to an input terminal of a PLE connected to the wiring PLEIN, shoot-through current is likely to be generated in a circuit element connected to the input terminal of the PLE. However, the potential of the wiring PLEIN can be initialized by turning on the transistor 105. This can prevent the input terminal of the PLE from having the intermediate potential immediately after power-on, and generation of shoot-through current in the circuit element connected to the input terminal of the PLE can be avoided.

The cell array 31 may include a latch circuit 106. FIG. 8A shows a configuration example in which the latch circuit 106 includes an inverter 107 and a transistor 108. An input terminal and an output terminal of the inverter 107 are connected to the wiring PLEIN and a gate of the transistor 108, respectively. One of a source and a drain and the other of the transistor 108 are connected to the wiring PLEIN and a wiring to which a predetermined potential is supplied, respectively. The latch circuit 106 has a function of retaining the potential of the wiring PLEIN, whereby the wiring PLEIN can be prevented from being floating. Thus, the input terminal of the PLE can be prevented from having the intermediate potential, and generation of shoot-through current in a circuit element connected to the input terminal can be avoided.

Note that the latch circuit 106 can have a configuration shown in FIG. 8B. The latch circuit 106 in FIG. 8B includes inverters 109 and 110. An input terminal and an output terminal of the inverter 109 are connected to the wiring PLEIN and an input terminal of the inverter 110, respectively. An output terminal of the inverter 110 is connected to the wiring PLEIN. With this configuration, the potential of the wiring PLEIN can be maintained regardless of whether it is high or low, and the wiring PLEIN can be prevented from being floating more effectively.

Note that the wiring to which a predetermined potential is supplied and which is connected to the transistor 105 and the wiring to which a predetermined potential is supplied and which is connected to the transistor 108 may be either high power supply lines or low power supply lines (e.g., ground lines). Furthermore, the level of the predetermined potentials is not limited to 0 volts. Without limitation to the example in which the latch circuit 106 includes the inverters 107 or the inverters 109 and 110 in FIGS. 8A and 8B, an element having a function of inverting the polarity of an input signal can be substituted for the inverters 107, 109, and 110.

Furthermore, without limitation to the example in which the transistors 101, 102, 103, and 105 are n-channel transistors and the transistor 108 is a p-channel transistor shown in FIGS. 8A and 8B, the transistors 101, 102, 103, 105, and 108 may be either an n-channel transistor or a p-channel transistor.

The cells 32[1,1] to [x,y] may further include another circuit element such as a transistor, a diode, a resistor, a capacitor, or an inductor as needed.

When the circuit 12 is used as a test circuit, configuration data for reconfiguring the circuit 12 to a test circuit is stored in the cells 32[1,1] to [x,y]. Specifically, the potential of the wiring WWL[1] is controlled to turn on the transistors 101 included in the cells 32[1,1] to [1,y], and accordingly the potentials of the wiring BL[1] to [y] are supplied to the memory circuits 104. As a result, configuration data is stored in the cells 32[1,1] to [1,y]. Then, the potential of the wiring WWL[x] is controlled to turn on the transistors 101 in the cells 32[x,1] to [x,y], and accordingly the potentials of the wiring BL[1] to [y] are supplied to the memory circuits 104. As a result, configuration data is stored in the cells 32[x,1] to [x,y]. In accordance with the configuration data stored in the cells 32[1,1] to [x,y], the conduction of the transistors 102 is controlled. Consequently, the conduction of the cells 32 in the row selected by the wirings CWL[1] to [x] from among the cells 32[1,1] to [x,y] can be controlled, and the conduction between the wiring PLEIN and the wirings SL[1] to [y] can be controlled accordingly.

As described above, configuration data for a test circuit is stored in the cells 32[1,1] to [x,y] to control the conduction between the plurality of PLE 15 or between the PLE 15 and an input/output device; thus, the circuit 12 can be reconfigured to a test circuit. Note that a test pattern generated in the circuit 12 can be easily changed by changing the configuration data stored in the cells 32[1,1] to [x,y].

When the PLE 15 has a function of storing configuration data for changing circuit configuration of a logic circuit in addition to a function as the logic circuit, the configuration data is changed so that circuit configuration of the PLE 15 is changed, whereby the circuit 12 can be reconfigured to a test circuit.

In contrast, when the circuit 12 is used as an extension circuit, data used for the operation of the circuit 11 is stored in the cells 32[1,1] to [x,y] by the similar operation. The transistor 105 is then turned on to set the potential of the wiring PLEIN low, and then the potentials of the wirings CWL[1] to [x] are controlled to select cells 32 in a specific row from among the cells 32[1,1] to [x,y], so that signals corresponding to data stored in the cells 32 in the specific row are output to the wirings SL[1] to [y]. Consequently, the cells 32 can be used as a memory device capable of writing and reading data.

When a copy of part of data stored in the memory device is stored in the cells 32[1,1] to [x,y], for example, the cell array 31 can be used as a cache memory of the circuit 11. In that case, the cells 32[1,1] to [1,y] can serve as a line in the first row of the cache memory and the cells 32[x,1] to [x,y] can serve as a line in the x-th row of the cache memory. The cell array 31 can thus be used as a cache memory with x lines and y bits.

In the transistors 101, 102, 103, 105, and 108 in FIGS. 8A and 8B and FIGS. 9A to 9E, a material for a semiconductor film where a channel formation region is formed can be a variety of materials such as silicon, germanium, silicon germanium, and an oxide semiconductor.

Since the transistor 101 has a function of holding data stored in the memory circuit 104, the off-state current of the transistor 101 is preferably ultra-low, thereby preventing leakage of charge stored in the memory circuit 104 through the transistor 101. Consequently, the configuration data stored in cells 32 can be retained for a long time. A transistor in which a channel formation region is formed in a film of a semiconductor with a wider bandgap and lower intrinsic carrier density than silicon or the like can have extremely low off-state current and thus is preferably used as the transistor 101. As such a semiconductor, for example, an oxide semiconductor, silicon carbide, gallium nitride, gallium oxide, and the like each have a band gap greater than or equal to twice the band gap of silicon can be given. Off-state current of the transistor including an oxide semiconductor can be extremely small as compared to that of a transistor formed using a material other than an oxide semiconductor, such as silicon or germanium. The use of the transistor 101 including an oxide semiconductor can prevent leakage of charge stored in the memory circuit 104.

The transistors 102 and 103 need high current supply capability in order to increase reading speed of data stored in the cells 32. The transistor 105 also needs high current supply capability in order to initialize the potential of the wiring PLEIN at high speed. Thus, the transistors 102, 103, and 105 are preferably formed using a material other than an oxide semiconductor, for example, silicon. This can increase the current supply capability of the transistors 102, 103, and 105.

A transistor using an oxide semiconductor and a transistor using a material other than an oxide semiconductor are used in appropriate combination depending on intended functions; thus, both long-term data retention and high-speed circuit operation can be achieved.

Note that a p-channel transistor formed using a material other than an oxide semiconductor (e.g., silicon) can be formed easier than a p-channel transistor formed using an oxide semiconductor. Thus, a p-channel transistor used as the transistors 101, 102, 103, 105, and 108 is preferably formed using a material other than an oxide semiconductor. Consequently, yield in the manufacturing process of the device can be increased.

Because initialization of the potential of the wiring PLEIN needs to be performed by turning on the transistor 105 when data in the cells 32[1,1] to [x,y] are read out, the on/off state of the transistor 105 is preferably switched quickly. For this reason, the transistor 105 preferably has current supply capability higher than that of the transistors 102 and 103. Thus, the ratio of channel width to channel length (W/L) of the transistor 105 is preferably larger than that of the transistor 102. Further, it is preferable that W/L of the transistor 105 be larger than W/L of the transistor 103. With this structure, a reduction in size of the cell array 31 with a reduction in W/L of the transistor 102 or 103 and an increase in initialization speed of the wiring PLEIN with an increase in W/L of the transistor 105 can be achieved at the same time.

Figure 9A:
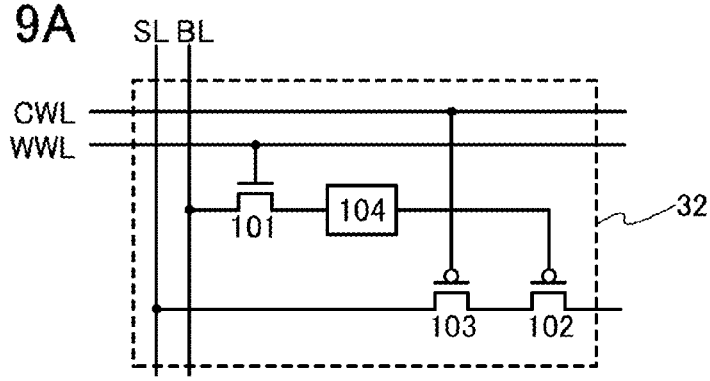
FIGS. 9A to 9E are circuit diagrams illustrating examples of a structure of a device.

Note that the cells 32 are not limited to having the above configuration and may include a switch or the like between the wiring, the transistor, and the capacitor. Positions of the switches and connection relations among the wirings may be changed. For example, as shown in FIG. 9A, the transistor 103 may be provided between the wiring SL and the transistor 102. In that case, the gate of the transistor 103 is connected to the wiring CWL, one of the source and drain is connected to the wiring SL, and the other thereof is connected to one of the source and drain of the transistor 102. As compared to the configuration in FIG. 8A, the configuration can suppress noise generated in the wiring PLEIN due to a change in the potential of the wiring CWL. Thus, malfunction of a PLE and the like connected to the wiring PLEIN can be prevented.

Figure 9B:
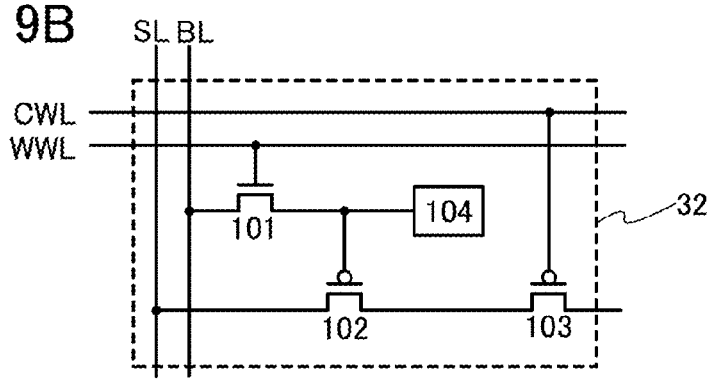
Figure 9C:
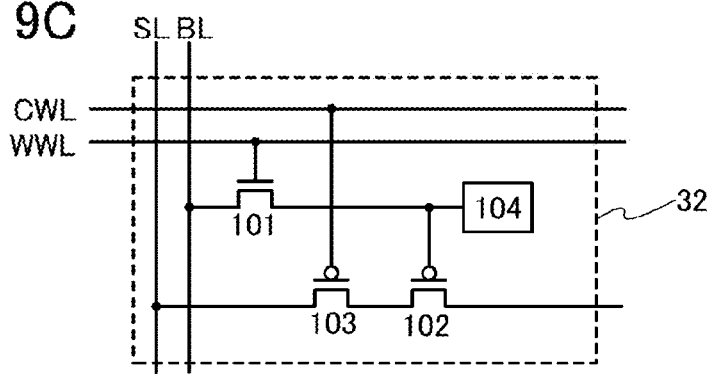

The memory circuit 104 may have a structure shown in FIG. 9B in which one terminal of the memory circuit 104 is connected to one of the source and drain of the transistor 101 and the gate of the transistor 102. The cell 32 in FIG. 9B may include the transistor 103 between the wiring SL and the transistor 102 (see FIG. 9C).

Figure 9D:
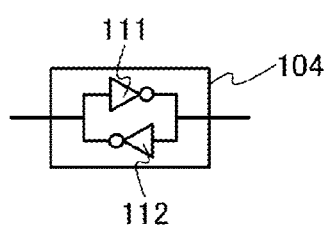
Figure 9E:
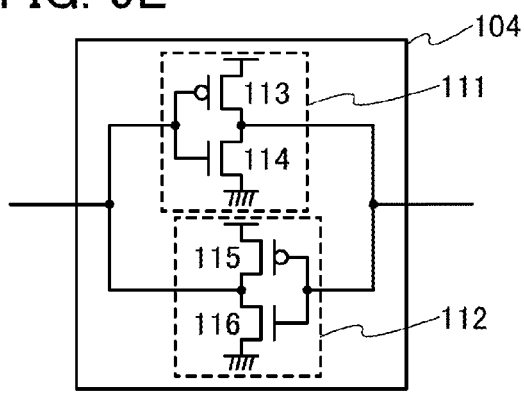

The memory circuit 104 can include inverters 111 and 112 as in FIG. 9D, for example. An output terminal of the inverter 111 is connected to an input terminal of the inverter 112. An output terminal of the inverter 112 is connected to an input terminal of the inverter 111. As shown in FIG. 9E, the inverter 111 can include transistors 113 and 114 and the inverter 112 can include transistors 115 and 116. The transistors 113 and 115 are p-channel transistors and the transistors 114 and 116 are n-channel transistors.

In the case where the cell 32 includes a transistor using an oxide semiconductor and a transistor using a material other than an oxide semiconductor, the transistors are preferably stacked to each other. For example, an insulating layer is formed over the transistor using material other than an oxide semiconductor, and the transistor using an oxide semiconductor is formed over the insulating layer. The area of the cell 32 with this structure can be smaller than that of a cell 32 in which all of the transistors are formed in one layer.

In the case where the memory circuit 104 in FIG. 9E is used for the cell 32, the n-channel transistors 101, 114, and 116 using oxide semiconductors are formed over the p-channel transistors 102, 103, 113, and 115 using materials other than oxide semiconductors, for example. Here, the transistors 101, 114, and 116 can be formed in one process, and the transistors 102, 103, 113, and 115 can be formed in one process; thus, yield can be improved. Furthermore, because the transistor1 101, 114, and 116 are stacked over the transistors 102, 103, 113, and 115, the area of the cell 32 can be reduced.

Examples of the structure in which a transistor using an oxide semiconductor and a transistor using a material other than an oxide semiconductor are stacked to each other are shown in Embodiments 5 and 6.

Next, an operation example of the cell array 30 shown in FIG. 6 is described.

Figure 10:
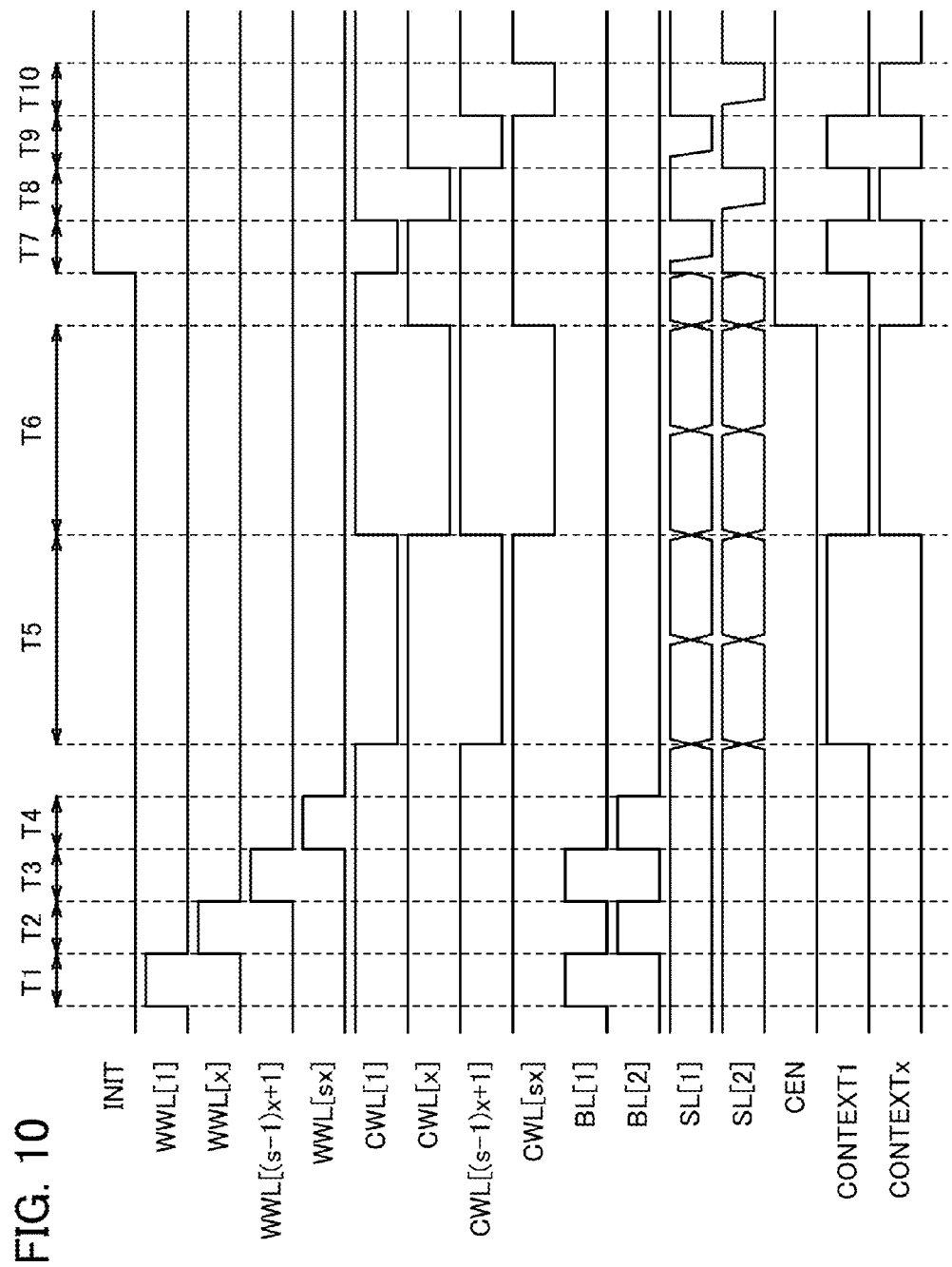
FIG. 10 is a timing chart.

FIG. 10 shows a timing chart showing the operation example of the cell array 30. Note that configurations of the cell 32 and the memory circuit 104 here are those in FIG. 8A and FIG. 9D, respectively. That is, one of the source and drain of the transistor 101 is connected to the input terminal of the inverter 111 and the output terminal of the inverter 112. The gate of the transistor 102 is connected to the output terminal of the inverter 111 and the input terminal of the inverter 112.

First, operation in Periods T1 to T4 for writing data to the cells 32 is described. Although not shown in FIG. 10, low-level data may be stored in all of the cells 32[1,1] to [x,y] immediately after the circuit 12 is powered (not shown in FIG. 10). Specifically, all the potentials of the wirings WWL[1] to [sx] are set high and all the potentials of the wirings BL[1] to [y] are set low, whereby data stored in all the cells 32[1,1] to [x,y] can have a low potential. Consequently, unexpected short-circuit between the wirings SL[1] to [y] can be avoided, and the potential of the wiring PLEIN is prevented from having an undefined value, so that unnecessary current consumption can be reduced.

First, in the period T1, a signal containing data on an address in a selected row (hereinafter referred to as address signal) is supplied from the wiring WADR to the circuit 46, and the circuit 46 decodes the address signal (see FIG. 6) to set the potential of the wiring WWL[1] high. The wirings BL[1] and BL[2] are set high and low, respectively. As a result, the potential of the BL[1] is supplied to the memory circuit 104 of the cell 32[1,1] (see FIG. 8A), so that high-level data is stored in the cell 32[1,1]. In addition, the potential of the BL[2] is supplied to the memory circuit 104 of the cell 32[1,2], so that low-level data is stored in the cell 32[1,2].

Since the memory circuits 104 in the cells 32 [1,1] and [1,2] have the configuration in FIG. 9D, inverted signals of data stored in the cells 32[1,1] and [1,2] is supplied to gates of the transistor 102 in the cells 32[1,1] and [1,2]. Specifically, the potential of the gate of the transistor in the cell 32[1,1] storing high-level data is set low, whereby the transistor 102 is turned on. Also in the cell 32[1,2] storing low-level data, the potential of the transistor 102 becomes high and the transistor 102 is turned off.

In Period T2, an address signal is supplied to the circuit 46 via the wiring WADR and is decoded by the circuit 46, whereby the potential of the wiring WWL[x] is set high. Furthermore, the potentials of the wirings BL[1] and BL[2]

are switched to low level and high level, respectively. As a result, low-level data and high-level data are stored in the cells 32[x,1] and [x,2], respectively. In the cell 32[x,1] storing low-level data, the potential of the gate of the transistor 102 becomes high and the transistor 102 is thus turned off. In the cell 32 [x,2] storing high-level data, the potential of the gate of the transistor 102 becomes low and the transistor 102 is thus turned on.

In Period T3, an address signal is supplied to the circuit 46 via the wiring WADR and is decoded by the circuit 46, whereby the potential of the wiring WWL[(s−1)x+1] is set high. Furthermore, the potentials of the wirings BL[1] and BL[2] are switched to high level and low level, respectively. As a result, high-level data and low-level data are stored in the cells 32[(s−1)x+1,1] and [(s−1)x+1,2], respectively.

In Period T4, an address signal is supplied to the circuit 46 via the wiring WADR and is decoded by the circuit 46, whereby the potential of the wiring WWL[sx] is set high. Furthermore, the potential of the wirings BL[1] and BL[2] are switched to low and high, respectively. As a result, low-level data and high-level data are stored in the cells 32[sx,1] and [sx,2], respectively.

Next, operation from Periods T5 to T6 during which the circuit 12 serves as a test circuit is described.

First, in Period T5, a low-level signal is supplied to the wiring CEN, whereby a signal for selecting all the plurality of cell arrays 31 is supplied from the circuit 44 to the circuit 45 via the wirings 47[1] to [s]. The potentials of the wirings CONTEXT1 and CONTEXTx are set high level and low level, respectively, whereby the potentials of the wirings CWL[1] and [(s−1)x+1] are changed to high level. Consequently, the cells 32[1,1] to [1,y] and the cells 32[(s−1)x+1, 1] to [(s−1)x+1, y] which are connected to the wirings CWL [1] and [(s−1)x+1] are selected. Then, the conduction of the selected cells 32 is determined by data stored in the each of the selected cells 32 to reconfigure the circuit 12.

In Period T6, the potentials of the wirings CONTEXT1 and CONTEXTx are changed to low level and high level, respectively. Consequently, the wirings CWL[x] and CWL[sx] connected to the wiring CONTEXTx become high, and the cells 32[x,1] to [x,y] and the cells 32[sx, 1] to [sx, y] which are connected to the wirings CWL[x] and [sx] are selected. Then, the conduction of the selected cells 32 are determined by data stored in the selected cells 32 to reconfigure the circuit 12.

Next, operation in Periods T7 to T10 during which the circuit 12 is used as an extension circuit, particularly as a cache memory, is described.

In Period T7, a high-level signal is supplied to the wiring CEN and an address signal is supplied via the wiring CADR, whereby a signal for selecting a specific cell array 31 (here the cell arrays 31 in the first row) from among a plurality of cell arrays 31 is supplied from the circuit 44 to the circuit 45 via the wirings 47[1] to [s]. The potential of the wiring CONTEXT1 is changed to high level and the potential of the wiring CONTEXTx remains low. Thus, in the cell arrays 31 in the first row, the potential of the wiring CWL[1] connected to the wiring CONTEXT1 becomes high, whereby the cells 32[1,1] to [1,y] connected to the wiring CWL[1] are selected. As a result, data reading operation is performed in the selected cells 32[1,1] to [1,y].

In addition, the potentials of the wirings SL[1] to [y] are first set high in Period T7. An address signal is then supplied to the circuit 44 via the wiring CADR and is decoded by the circuit 44. Furthermore, the potential of the wiring CONTEXT1 is set high and that of the wiring CONTEXTx is low (see FIG. 6), whereby the potential of the wiring CWL[1] is set high. In addition, the potential of the wiring NIT is set high (see FIG. 8A), whereby the potential of the wiring PLEIN is set low. Through the operation, the cell 32[1,1] storing high-level data is placed in a conduction state, and the potential of SL[1] becomes low accordingly. The cell 32[1,2] storing low-level data is placed in a non-conduction state, and thus the potential of SL[2] remains high. In the case where a PLE is connected to the SL[1] to [y], its output is preferably made to have high output impedance. Note that although in the timing chart in FIG. 10, the potential of the wiring that has a function of supplying a predetermined potential and is connected to the transistor 105 illustrated in FIG. 8A is low, the potential of the wiring may be high.

Then, the potentials of the wirings SL[1] to [y] are set high in Period T8. An address signal is supplied to the circuit 44 via the wiring CADR and is decoded by the circuit 44. Furthermore, the potential of the wiring CONTEXT1 is set low and that of the wiring CONTEXTx is high, whereby the potential of the wiring CWL[x] is set high. In addition, the potential of the wiring INIT is set high, whereby the potential of the wiring PLEIN is set low. Through the operation, the cell 32[x,1] storing low-level data is placed in a non-conduction state, and the potential of SL[1] becomes high accordingly. Furthermore, the cell 32[x,2] storing high-level data is placed in a conduction state, and the potential of SL[2] becomes low accordingly.

Next, the potentials of the wirings SL[1] to [y] are set high in Period T9. An address signal is then supplied to the circuit 44 via the wiring CADR and is decoded by the circuit 44. Furthermore, the potential of the wiring CONTEXT1 is set high and that of the wiring CONTEXTx is low, whereby the potential of the wiring CWL[(s−1)x+1] is set high. In addition, the potential of the wiring NIT is set high, whereby the potential of the wiring PLEIN is set low. Through the operation, the cell 32[(s−1)x+1,1] storing high-level data is placed in a conduction state, and the potential of SL[1] becomes low accordingly. The cell 32[(s−1)x+1,2] storing low-level data is placed in a non-conduction state, and thus the potential of SL[2] remains high.

Next, the potentials of the wirings SL[1] to [y] are set high in Period T10. An address signal is then supplied to the circuit 44 via the wiring CADR and is decoded by the circuit 44. Furthermore, the potential of the wiring CONTEXT1 is set low and that of the wiring CONTEXTx is high, whereby the potential of the wiring CWL[sx] is set high. In addition, the potential of the wiring NIT is set high, whereby the potential of the wiring PLEIN is set low. Through the operation, the cell 32[sx,1] storing low-level data is placed in a non-conduction state, and thus the potential of SL[1] remains high. The cell 32[sx,2] storing high-level data is placed in a conduction state, and thus the potential of SL[2] becomes low.

Since data stored in cells 32 can be read out by supply of the potential corresponding to data stored in the cell 32 to the wirings SL[1] to [y], the cells 32 can be used as a memory device for writing and reading data.

Because the circuit 43 in FIG. 7 can write serial data and parallel data and read the parallel data, the circuit 43 can write serial data or parallel data to cells 32 by the operation in the periods T1 and T2 and read the parallel data from the cells 32 by the operation in the periods T8 and T9.

Figure 11:
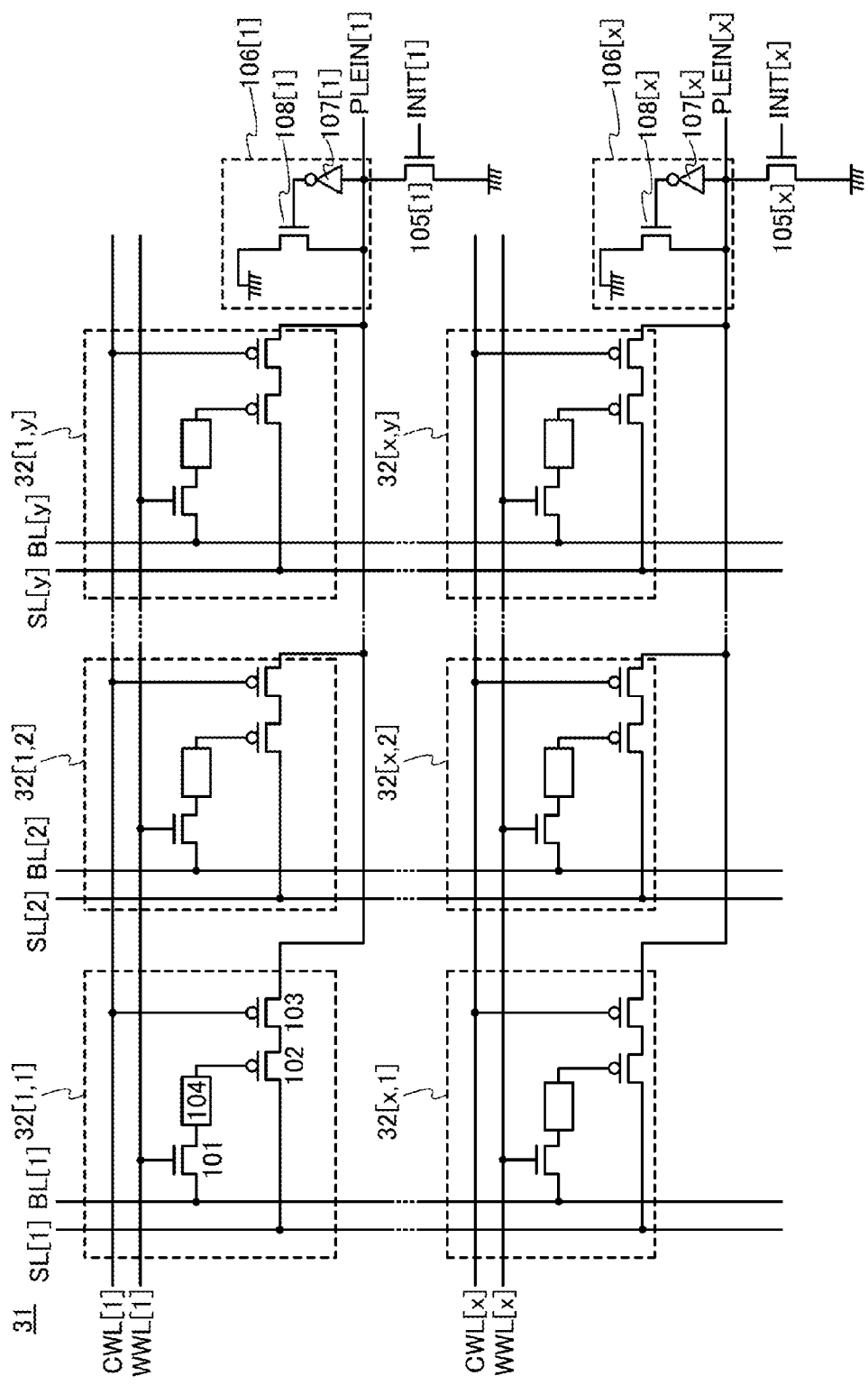
FIG. 11 is a circuit diagram illustrating an example of a structure of a device.

Note that the cell array 31 may have a configuration shown in FIG. 11. The cell array 31 in FIG. 11 includes a plurality of wirings PLEIN (wirings PLEIN[1] to [x]). The PLEIN[1] is connected to cells 32[1,1] to [1,y]. The PLEIN [x] is connected to cells [x,1] to [x,y]. Furthermore, the wiring PLEIN[1] is connected to a transistor 105[1] and a latch circuit 106[1]. The wiring PLEIN[x] is connected to a transistor 105[x] and a latch circuit 106[x]. In such a configuration in which the cells 32 are connected to different wirings PLEIN row by row, reading operation in the cells 32[1,1] to [x,y] can be performed row by row using the transistors 105[1] to [x]. This configuration can reduce parasitic capacitance of the wirings PLEIN as compared to the configuration shown in FIG. 8. Consequently, conditions for current supply capability required for the transistor 105 can be relieved and the degree of freedom of size and materials of the transistor 105 can be increased.

Although the circuit 12 is used as a cache memory when the circuit 11 operates in a normal mode in this embodiment, the circuit 12 may be used as a TLB in a virtual memory or a branch predictor circuit.

In the device of one embodiment of the present invention, when the circuit 12 serves as a test circuit, the circuit 17 outputs configuration data for a test circuit to cells 32; and when the circuit 11 performs normal operation, the circuit 17 outputs data used for processing in the circuit 11 to the cells 32 and read the data stored in the cells 32. This is why the circuit 12 can serve as a test circuit and an extension circuit. Thus, the circuit 12 used as a test circuit for testing operation of the circuit 11 can also serve as an extension circuit for a cache memory or the like when the circuit 11 performs normal operation. The area of a circuit that is unnecessary during normal operation of the circuit 11 can be reduced in the device 10.

Note that one embodiment of the present invention is not limited to the example in this embodiment in which a test circuit is unnecessary during normal operation of the circuit 11. That is, an arbitrary circuit that is unnecessary during normal operation of the circuit 11 can be reconfigured by the circuit 12. Also in that case, the area of a circuit that is unnecessary during normal operation can be reduced.

Note that one embodiment of the present invention is not limited to the example in this embodiment in which a cache memory is used as an extension circuit. For example, the circuit 12 may be used as a TLB in a virtual memory or a branch prediction circuit. The circuit 12 may be used as an arithmetic operation circuit such as a multiple circuit or a product-sum operation circuit. Furthermore, when a function as a cache memory and a function as an arithmetic circuit are switched in the circuit 12 during normal operation of the circuit 11, the circuit 12 can be used as both a cache memory and an arithmetic circuit.

Note that the description of this embodiment can be combined with description disclosed in this specification and the like, such as another description disclosed in this embodiment and the description of any of the other embodiments, as appropriate.

Embodiment 3

In this embodiment, a specific structure example of the circuit 43 in FIG. 7 is described.

Figure 12:
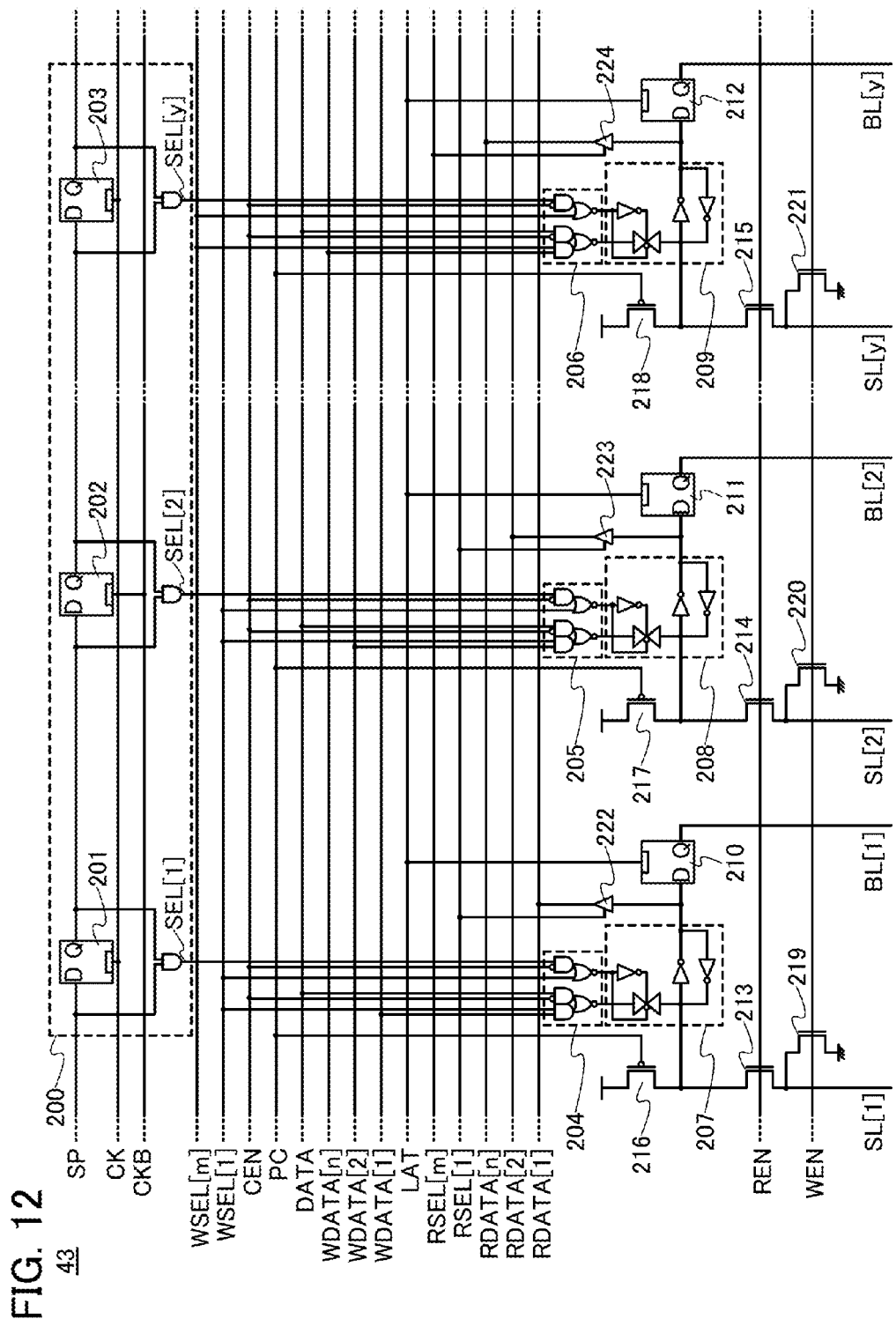
FIG. 12 is a circuit diagram illustrating an example of a structure of a device.

FIG. 12 shows a configuration example of the circuit 43. The circuit 43 includes a shift register 200, selection circuits 204 to 206, a line buffer including latch circuits 207 to 212, transistors 213 to 221, and enable buffers 222 to 224.

The shift register 200 includes latch circuits 201 to 203. A start pulse supplied through the wiring SP and a clock signal supplied through the wiring CK are input to the latch circuit 201. An input terminal and an output terminal of the latch circuit 201 are connected to input terminals of an AND circuit. An output terminal of the AND circuit is connected to a wiring SEL[1]. An output signal of the latch circuit 201 and an inverted clock signal supplied through the wiring CKB are input to the latch circuit 202. An input terminal and an output terminal of the latch circuit 202 are connected to input terminals of an AND circuit. An output terminal of the AND circuit is connected to a wiring SEL[2]. An output signal of a latch circuit in the previous stage and the clock signal supplied via the wiring CK or the inverted clock signal supplied via the wiring CKB are input to the latch circuit 203. The clock signal is input in FIG. 12. An input terminal and an output terminal of the latch circuit 203 are connected to input terminals of an AND circuit. An output terminal of the AND circuit is connected to a wiring SEL[y].

When the circuit 12 is used as a test circuit as shown in FIGS. 2A and 2B, a signal (e.g., a low-level signal) showing that the circuit 12 is used as a test circuit is supplied to the wiring CEN. A signal output to the wiring SEL[1] is used as a latch signal for the latch circuit 207. A signal output to the wiring SEL[2] is used as a latch signal for the latch circuit 208. A signal output to the wiring SEL[y] is used as a latch signal for the latch circuit 209.

As shown in FIG. 12, AND circuits and NOR circuits are connected, whereby forming the selection circuits 204 to 206. When the circuit 12 is used as an extension circuit, such as a cache memory, a signal (e.g., a high-level signal) showing that the circuit 12 is used as a cache memory is supplied to the wiring CEN. A signal output to a wiring WSEL[1] is used as latch signals for the latch circuits 207 and 208 and the like. A signal output to a wiring WSEL[m] is used as a latch signal for the latch circuit 209 and the like.

Inverters and analog switches are connected as shown in FIG. 12 for example, whereby forming the latch circuits 207 to 209. In the case where the circuit 12 is used as a test circuit, serial data are sequentially input to the wiring DATA and sequentially stored in the latch circuits 207 to 209 via the selection circuits 204 to 206. In the case where the circuit 12 is used as a cache memory, parallel data of n bits is input to wirings WDATA[1] to [n] and stored in the latch circuits 207, 208, and the like via the selection circuits 204, 205, and the like, and then, parallel data of n bits are input to wirings WDATA[1] to [n] and stored in the latch circuits 209 and the like via the selection circuits 206 and the like. That is, operation of storing parallel data by n bits in the latch circuits simultaneously is repeated m times and data of y (n×m=y) bits are stored in the latch circuits. Here, it is preferable that the potential of the wiring WEN be controlled so that the transistors 219 to 221 are turned on, whereby the potentials of the wiring SL[1] to [y] are set low. Consequently, the potential of one of the source and drain of the transistor 102 of the cells 32 connected to the wiring SL (see FIG. 8A) can be set low when data is written to the cells 32, achieving stable data writing.

The latch circuits 210 to 212 store data output from the latch circuits 207 to 209 in accordance with signals supplied to the wiring LAT. The data stored in the latch circuit 210 to 212 is supplied to the wirings BL[1] to [y].

In reading operation in the circuit 12 used as a cache memory, a signal supplied to the wiring REN is controlled so that the transistors 213 to 215 are turned on to connect the wirings SL[1] to [y] with the latch circuits 207 to 209. Here, signals corresponding to data stored in the cells 32 connected to the wirings SL[1] to [y] are supplied to the wirings SL[1] to [y] and stored in the latch circuits 207 to 209. Note that it is preferable that the potential of the wiring PC be controlled immediately before selecting which cell 32 to perform data reading so that the transistors 216 to 218 are turned on to precharge the wirings SL[1] to [y]. With this operation, data can be read out accurately regardless whether the data stored in the cell 32 is high or low.

The data stored in the latch circuits 207 to 209 from the cells 32 via the SL[1] to [y] is output by n bits to any of the wirings RDATA[1] to [n] which is connected to the enable buffers 222, 223, or 224 selected by signals supplied through wirings RSEL[1] to [m]. The data stored in the cells 32 can be thus read out as parallel data.

Note that data can be written to the cells 32 in a specific row at the same time by storing new data in all the latch circuits 207 to 209 and supplying the data to the wirings BL[1] to [y] via the latch circuits 210 to 212. That is, data stored in the cells 32 in the specific row can be updated in one process.

Data stored in the cells 32 in a specific row is stored in the latch circuits 207 to 209 via the wirings SL[1] to [y], new data is stored and rewritten to some of the latch circuits 207 to 209, and then, the data stored in the latch circuits 207 to 209 is supplied to the wirings BL[1] to [y] via the latch circuits 210 to 212. Consequently, data in some of the cells 32 in the specific row can be rewritten, i.e., data stored in some of the cells 32 in the specific row can be uploaded.

In addition, data stored in the cells 32 in a specific row is stored in the latch circuits 207 to 209 via the wirings SL[1] to [y] and is then supplied to the wirings BL[1] to [y] via latch circuits 210 to 212, whereby the data in the cells 32 in the specific row can be refreshed. This makes it possible to restore the lowered potentials of the gates of the transistors 102 and the memory circuits 104 in the cells 32.

As described above, the latch circuits 207 to 209 can be used as writing latch circuits or reading latch circuits. This eliminates the need of separately providing a writing latch circuit and a reading latch circuit; thus, the size and area of the circuit can be reduced.

As described, the circuit 43 shown in FIG. 12 can write serial data and parallel data to the cells 32 and read the parallel data from the cells 32.

Next, operation of the circuit 43 when the circuit 12 serves as a test circuit will be described.

Figure 13:
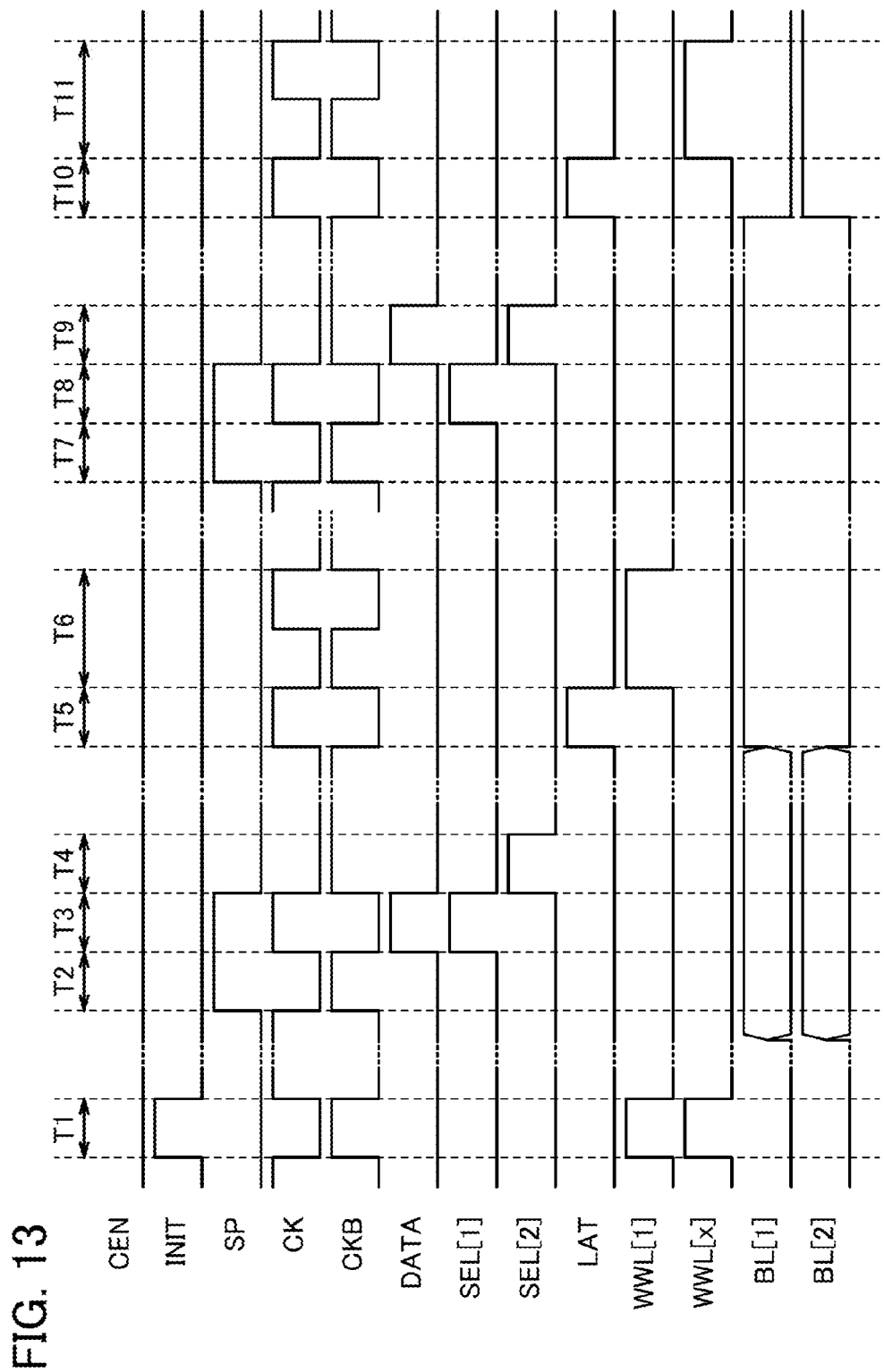
FIG. 13 is a timing chart.

FIG. 13 is a timing chart for describing writing operation when the circuit 12 is used as a test circuit. Note that in periods T1 to T11, a low-level signal showing that the circuit 12 is used as a test circuit is supplied to the wiring CEN.

First, in the period T1, the potentials of the wiring NIT and the wirings WWL[1] to [x] are set high and the potentials of the wirings BL[1] to [y] are set low, whereby low-level data is stored in all of the cells 32[1,1] to [x,y]. Consequently, unexpected short-circuit between the wirings SL[1] to [y] can be avoided, and the potential of the wiring PLEIN is prevented from having an undefined value, so that unnecessary current consumption can be reduced.

Next, the potential of the wiring SP is set high in periods T2 and T3. The potential of the wiring SEL[1] is turned to high in the period T3, whereby high-level data corresponding to the potential of the wiring DATA in the period T3 is stored in the latch circuit 207. The potential of the wiring SEL[2] is turned to high in the period T4, whereby low-level data corresponding to the potential of the wiring DATA in the period T4 is stored in the latch circuit 208. Note that another latch circuit which is controlled by an inverted clock signal supplied from the wiring CKB may be added in the previous stage of the latch circuit 201 in order to control the potential of the wiring SP as in FIG. 13.

In the period T5, the potential of the wiring LAT is set high. At that time, data stored in the latch circuits 207 to 209 is stored in the latch circuits 210 to 212 and output to the wirings BL[1] to [y]. Consequently, the potentials of the wiring BL[1] and [2] are turned to high and low, respectively.

In the period T6, the potential of the wiring WWL[1] is set high. At that time, the cells 32[1,1] to [1,y] connected to the wiring WWL[1] are selected as cells to be written. High-level data corresponding to the potential of the wiring BL[1] is stored in the cell 32[1,1], and low-level data corresponding to the potential of the wiring BL[2] is stored in the cell 32[1,2].

Next, the potential of the wiring SP is set high in the periods T7 and T8. The potential of the wiring SEL[1] is turned to high in the period T8, whereby low-level data corresponding to the potential of the wiring DATA in the period T8 is stored in the latch circuit 207. The potential of the wiring SEL[2] is turned to high in the period T9, whereby high-level data corresponding to the potential of the wiring DATA in the period T9 is stored in the latch circuit 208.

In the period T10, the potential of the wiring LAT is set high. At that time, data stored in the latch circuits 207 to 209 is stored in the latch circuits 210 to 212 and output to the wirings BL[1] to [y]. Consequently, the potentials of the wirings BL[1] and [2] are turned to low and high, respectively.

In the period T11, the potential of the wiring WWL[x] is set high. At that time, the cells 32[x,1] to [x,y] connected to the wiring WWL[x] are selected as cells to be written. Low-level data corresponding to the potential of the wiring BL[1] is stored in the cell 32[x,1], and high-level data corresponding to the potential of the wiring BL[2] is stored in the cell 32[x,2].

The similar operation is performed in the cells 32 in all of the rows, whereby predetermined data is written and stored in all of the cells 32[1,1] to [sx,y]. As a result, the circuit 12 is reconfigured to a test circuit using the data as configuration data so as to generate test patterns and the like.

Next, the operation of the circuit 43 when the circuit 12 is used as a cache memory is described.

Figure 14:
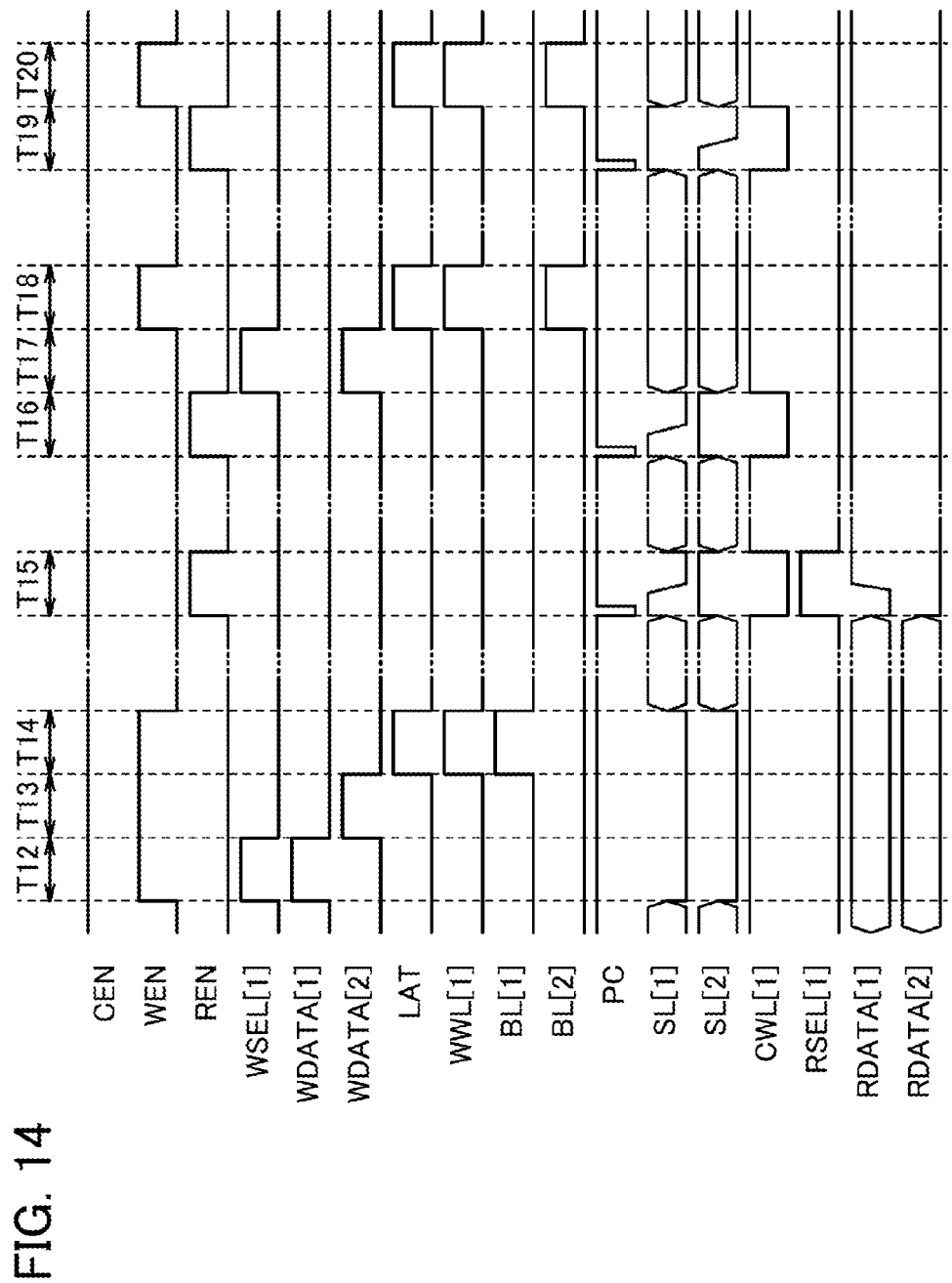
FIG. 14 is a timing diagram.

FIG. 14 is a timing chart for describing writing operation and reading operation when the circuit 12 is used as a cache memory. Periods T12 to T14 correspond to operation for writing data to cells 32. A period T15 corresponds to operation for reading data from the cells 32. Periods T16 to T18 corresponds to operation for rewriting data stored some of the cells. Periods T19 to T20 correspond to operation for refreshing data of the cache memory. Note that in the periods T12 to T20, a high-level signal showing that the circuit 12 is used as a cache memory is supplied to the wiring CEN.

First, in the period T12, the potentials of the wirings WEN, WSEL[1], and WDATA[1] are set high, and the potential of the wiring WDATA[2] is set low. High-level data and low-level data are thus stored in the latch circuit 207 and the latch circuit 208, respectively.

In the period T13, the potential of the wiring WEN and the potential of the wiring WSEL[m] (not shown) are set high, the potential of the wiring WDATA[1] is set low, and the potential of the wiring WDATA[2] is set high. As a result, low-level data is stored in a latch circuit (not shown) connected to the wirings WSEL[m] and WDATA[1], and high-level data is stored in a latch circuit (not shown) connected to the wirings WSEL[m] and WDATA[2].

In the period T14, the potentials of the wirings WEN, LAT, and WWL[1] are set high. At that time, high-level data stored in the latch circuit 207 is stored in the latch circuit 210 and output to the wiring BL[1]. Furthermore, low-level data stored in the latch circuit 208 is stored in the latch circuit 211 and output to the wiring BL[2]. Thus, the potentials of the wirings BL[1] and BL[2] are high and low, respectively. The cells 32[1,1] to [1,y] connected to the wiring WWL[1] are selected as cells to be written. High-level data corresponding to the potential of the wiring BL[1] is stored in the cell 32[1,1], and low-level data corresponding to the potential of the wiring BL[2] is stored in the cell 32[1,2]. Note that it is preferable that the potential of the wiring WEN be set high in the period T14 so that the transistors 219 to 221 are turned on, thereby making the wiring SL[1] to [y] to low potential. Consequently, the potential of one of the source and drain of the transistor 102 of the cells 32 connected to the wiring SL can be set low when data is written to the cells 32, achieving stable data writing.

In the period T15, the potentials of the wirings REN and CWL[1] are set low, whereby the cells 32[1,1] to [1,y] in the first row connected to the wiring CWL[1] are selected to be read, so that signals corresponding to data stored in the cells 32[1,1] to [1,y] are output to the wiring SL[1] to [y]. Specifically, since the potential of the wiring CWL[1] is set low, the transistors 103 in the cells 32[1,1] and [1,2] are turned on. The transistor 102 in the cell 32[1,1] storing high-level data is turned on. The transistor 102 in the cell 32[1,2] storing low-level data is turned off. Consequently, the cells 32[1,1] and [1,2] are turned on and off, respectively, and the potentials of the wirings SL[1] and [2] are low and high, respectively. Note that configurations of the cell 32 and the memory circuit 104 here are those in FIG. 8A and FIG. 9D, respectively. That is, one of the source and drain of the transistor 101 is connected to the input terminal of the inverter 111 and the output terminal of the inverter 112. The gate of the transistor 102 is connected to the output terminal of the inverter 111 and the input terminal of the inverter 112.

Furthermore, since the potential of the wiring REN is supplied to the gate of the transistors 213 to 215, the transistors 213 to 215 are turned on and thus data corresponding to the potentials of the wirings SL[1] to [y] are stored in the latch circuits 207 to 209. Specifically, high-level data and low-level data are stored in the latch circuits 207 and 208, respectively. Note that it is preferable that the potential of the wiring PC be set low and the transistors 216 to 218 be turned on at the beginning of the period T15, whereby precharging the wirings SL[1] to [y]. With this configuration, data can be read out accurately regardless whether the data stored in the cell 32 is high or low.

The potential of the wiring RSEL[1] is set high, whereby data stored in the latch circuits 207 and 208 are output to the wirings RDATA[1] and RDATA[2] via the enable buffers 222 and 223, respectively.

In the period T16, the potentials of the wirings REN and CWL[1] are set high, thereby outputting signals corresponding to data stored in the cells 32[1,1] to [1,y] to the wirings SL[1] to [y]. By the operation similar to that in the period T15, data corresponding to the potentials of the wirings SL[1] to [y] is stored in the latch circuits 207 to 209. Here, high-level data and low-level data are stored in the latch circuits 207 and 208, respectively.

In the period T17, the potential of the wiring WSEL[1] is set high, the potential of the wiring WDATA[1] remains low, and the potential of the wiring WDATA[2] is set high, whereby low-level data and high-level data are stored in the latch circuits 207 and 208, respectively.

In the period T18, the potentials of the wirings WEN, LAT, and WWL[1] are set high. At that time, low-level data stored in the latch circuit 207 is stored in the latch circuit 210 and output to the wiring BL[1]. Furthermore, high-level data stored in the latch circuit 208 is stored in the latch circuit 211 and output to the wiring BL[2]. Thus, the potentials of the wirings BL[1] and BL[2] are low and high, respectively. The cells 32[1,1] to [1,y] connected to the wiring WWL[1] are selected as cells to be written. Low-level data corresponding to the potential of the wiring BL[1] is stored in the cell 32[1,1], and high-level data corresponding to the potential of the wiring BL[2] is stored in the cell 32[1,2]. Note that it is preferable that the potential of the wiring WEN be set high in the period T18 so that the transistors 219 to 221 are turned on, thereby making the wiring SL[1] to [y] to low potential. Consequently, the potential of one of the source and drain of the transistor 102 of the cells 32 connected to the wiring SL (see FIG. 8) can be set low when data is written to the cells 32, achieving stable data writing.

In the period T19, the potentials of the wirings REN and CWL[1] are set high, thereby outputting signals corresponding to data stored in the cells 32[1,1] to [1,y] to the wirings SL[1] to [y]. By the operation similar to that in the period T16, data corresponding to the potentials of the wirings SL[1] to [y] is stored in the latch circuits 207 to 209. Here, low-level data and high-level data are stored in the latch circuits 207 and 208, respectively.

In the period T20, the potentials of the wirings WEN, LAT, and WWL[1] are set high. At that time, low-level data stored in the latch circuit 207 is stored in the latch circuit 210 and output to the wiring BL[1]. Furthermore, high-level data stored in the latch circuit 208 is stored in the latch circuit 211 and output to the wiring BL[2]. Thus, the potentials of the wirings BL[1] and BL[2] are low and high, respectively. The cells 32[1,1] to [1,y] connected to the wiring WWL[1] are selected as cells to be written. Low-level data corresponding to the potential of the wiring BL[1] is stored in the cell 32[1,1], and high-level data corresponding to the potential of the wiring BL[2] is stored in the cell 32[1,2]. Note that it is preferable that the potential of the wiring WEN be set high in the period T20 so that the transistors 219 to 221 are turned on, thereby making the wiring SL[1] to [y] to low potential. Consequently, the potential of one of the source and drain of the transistor 102 of the cells 32 connected to the wiring SL can be set low when data is written to the cells 32, achieving stable data writing.

Although the circuit 12 is used as a cache memory when the circuit 11 operates in a normal mode in this embodiment, the circuit 12 may be used as a TLB in a virtual memory or a branch predictor circuit.

In the device of one embodiment of the present invention, when the circuit 12 serves as a test circuit, the circuit 17 outputs configuration data for a test circuit to cells 32; and when the circuit 11 performs normal operation, the circuit 17 outputs data used for processing in the circuit 11 to the cells 32 and read the data stored in the cells 32. This is why the circuit 12 can serve as a test circuit and an extension circuit. Thus, the circuit 12 used as a test circuit for testing operation of the circuit 11 can also serve as an extension circuit for a cache memory or the like when the circuit 11 performs normal operation. The area of a circuit that is unnecessary during normal operation of the circuit 11 can be reduced in the device 10.

Note that one embodiment of the present invention is not limited to the example in this embodiment in which a test circuit is unnecessary during normal operation of the circuit 11. That is, an arbitrary circuit that is unnecessary during normal operation of the circuit 11 can be reconfigured by the circuit 12. Also in that case, the area of a circuit that is unnecessary during normal operation can be reduced.

Note that one embodiment of the present invention is not limited to the example in this embodiment in which a cache memory is used as an extension circuit. For example, the circuit 12 may be used as a TLB in a virtual memory or a branch prediction circuit. The circuit 12 may be used as an arithmetic operation circuit such as a multiple circuit or a product-sum operation circuit. Furthermore, when a function as a cache memory and a function as an arithmetic circuit are switched in the circuit 12 during normal operation of the circuit 11, the circuit 12 can be used as both a cache memory and an arithmetic circuit.

Note that the description of this embodiment can be combined with description disclosed in this specification and the like, such as another description disclosed in this embodiment and the description of any of the other embodiments, as appropriate.

Embodiment 4

Figure 15:
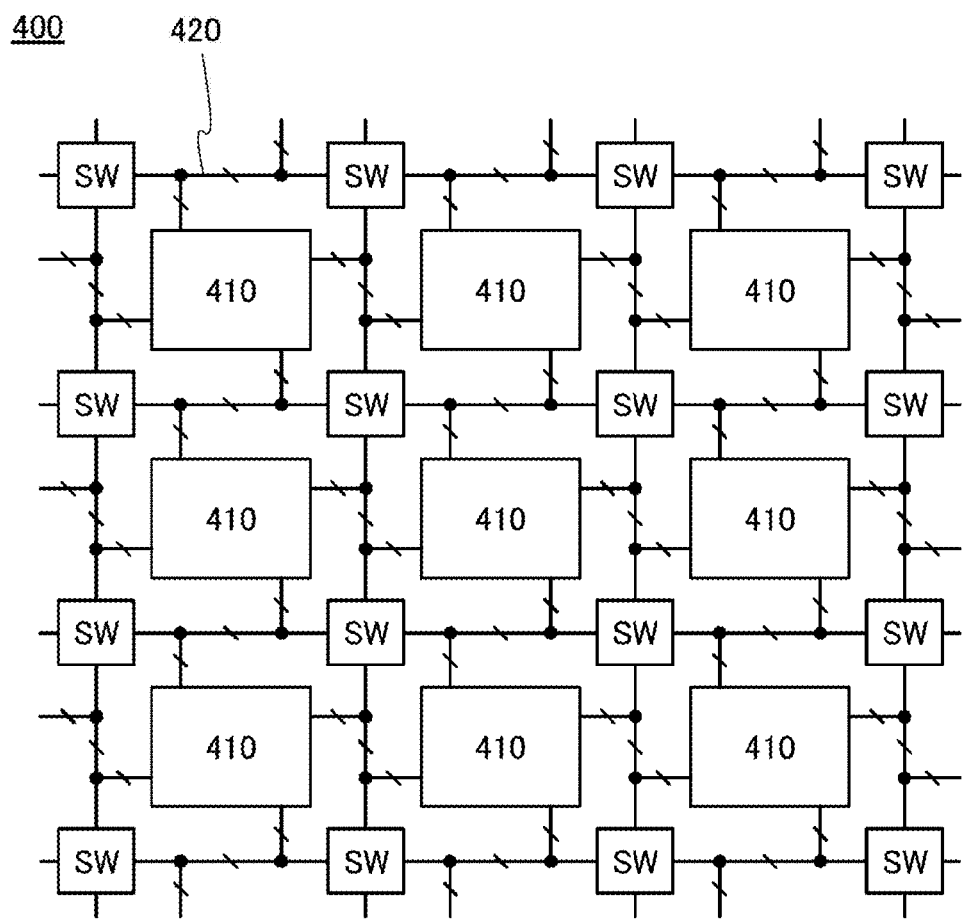
FIG. 15 is a circuit diagram illustrating an example of a structure of a device.

In this embodiment, a structure example of a PLD which can be used in the circuit 12 (see FIGS. 1 to 5) is described.
<Structural Example of Logic Array>
FIG. 15 illustrates an example of a partial structure of a PLD 400. The PLD 400 includes a plurality of PLE 410 (corresponding to the PLE 15 in FIGS. 1 to 5), a plurality of wirings 42 electrically connected to input or output terminals of the plurality of PLE 410, and a plurality of switch circuits SW (corresponding to the SW 16 in FIGS. 1 to 5) having a function of controlling electrical connection between the wirings 420. The electrical connection between the PLE 410 is controlled with the plurality of wirings 420 and the plurality of switch circuits SW.

Figure 16A:
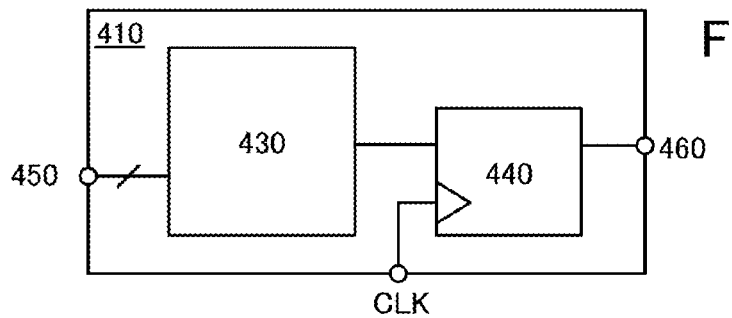
FIGS. 16A to 16D are circuit diagrams illustrating examples of a structure of a device.

Note that in addition to the wirings 420 electrically connected to the input or output terminals of the plurality of PLE 410, the PLD 400 in FIG. 15 may be provided with wirings having a function of supplying a clock signal or a signal RES to the PLE 410. The clock signal can be used to control the timing of signal output from a flip-flop of the PLE 410, for example. The signal RES can be used to control the timing of initialization of data stored in the flip-flop of the PLE 410, for example.
<Structural Example of PLE>
Next, structural examples of the PLE 410 are described.
FIG. 16A illustrates one embodiment of the PLE 410. The PLE 410 in FIG. 16A includes a look-up table (LUT) 430 and a flip-flop 440. In the LUT 430, the logical value of an output signal with respect to the logical value of an input signal that is input to an input terminal 450 is determined according to data including circuit information. The flip-flop 440 holds data contained in the output signal of the LUT 430 and outputs an output signal corresponding to the data in synchronization with a clock signal from an output terminal 460.

The type of the flip-flop 440 may be determined by the data including circuit information. Specifically, the flip-flop 440 may have a function of any of a D flip-flop, a T flip-flop, a JK flip-flop, and an SW flip-flop depending on the data including circuit information.

Figure 16B:
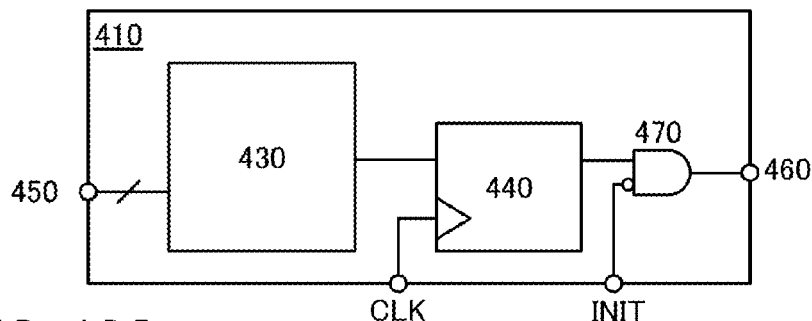

FIG. 16B illustrates another embodiment of the PLE 410. The PLE 410 illustrated in FIG. 16B includes an AND circuit 470 in addition to the components of the PLE 410 in FIG. 16A. To the AND circuit 470, a signal from the flip-flop 440 is supplied as an active high input, and the potential of a signal NIT is supplied as an active low input. With the above configuration, the potential of the output terminal 460 can be initialized according to the potential of the signal NIT.

Figure 16C:
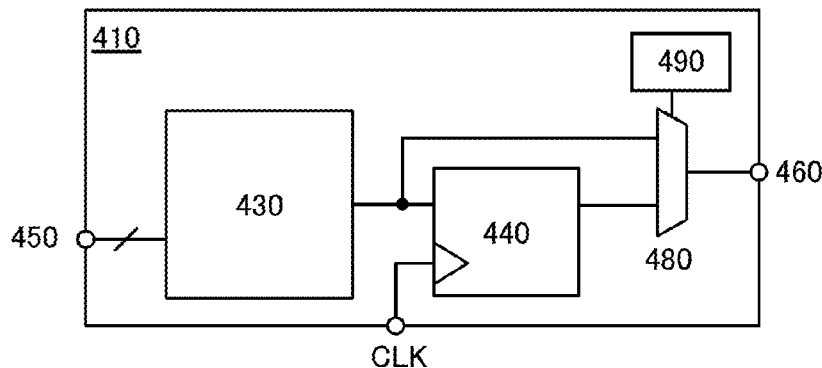

FIG. 16C illustrates another embodiment of the PLE 410. The PLE 410 in FIG. 16C includes a multiplexer 480 in addition to the components of the PLE 410 in FIG. 16A. In addition, the PLE 410 in FIG. 16C includes a memory circuit 490.

In the LUT 430, the logical value of an output signal with respect to the logical value of an input signal is determined according to data including circuit information. A signal output from the LUT 430 and a signal output from the flip-flop 440 are input to the multiplexer 480. The multiplexer 480 has functions of selecting and outputting one of the two output signals in accordance with data stored in the memory circuit 490. The signal output from the multiplexer 480 is output from the output terminal 460.

Figure 16D:
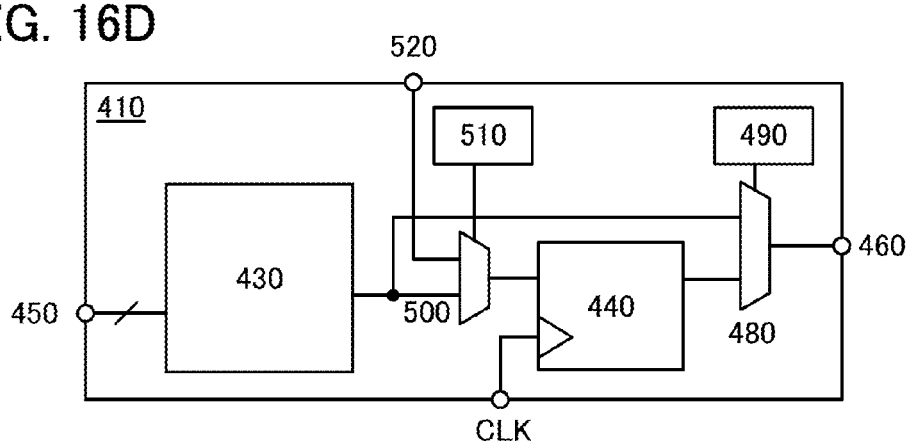

FIG. 16D illustrates another embodiment of the PLE 410. The PLE 410 in FIG. 16D includes a multiplexer 500 in addition to the components of the PLE 410 in FIG. 16C. In addition, the PLE 410 in FIG. 16D includes a memory circuit 51.

A signal output from the LUT 430 and a signal output from the flip-flop 440 of another PLE 410 and input through a terminal 520 are input to the multiplexer 500. The multiplexer 500 has functions of selecting and outputting one of the two output signals in accordance with data including circuit information which is stored in the memory circuit 510.
<Memory Circuit>
Next, a structural example of a memory circuit which is included in a PLE and has a function of storing circuit information is described.

Figure 17:
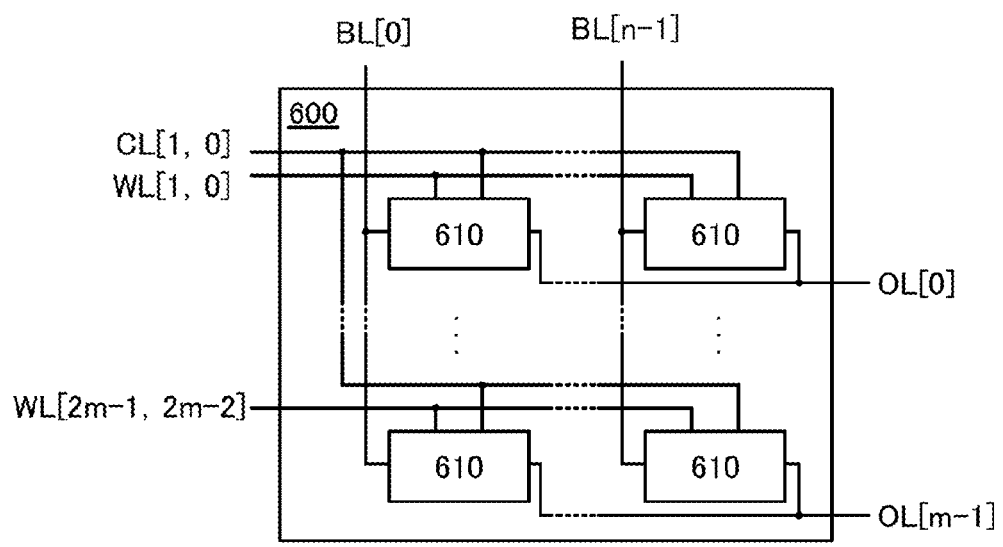
FIG. 17 illustrates an example of a structure of a device.

FIG. 17 illustrates a structure of a memory circuit 600 as an example. The memory circuit 600 can be used as the memory circuit 490 in FIG. 16C or the memory circuit 490 or 510 in FIG. 16D. The memory circuit 600 can also be used as a memory circuit included in the LUT 430.

The memory circuit 600 includes a plurality of circuits 610 having a function of storing data. FIG. 17 illustrates an example in which the plurality of circuits 610 are arranged in m rows and n columns. The circuit 610 in an i-th column and a j-th row (i represents a natural number smaller than or equal to n, and j represents a natural number smaller than or equal to m) is electrically connected to a wiring BL[i−1], a wiring CL[1,0], a wiring WL[2j−1,2j−2], and a wiring OL[j−1].

Figure 18A:
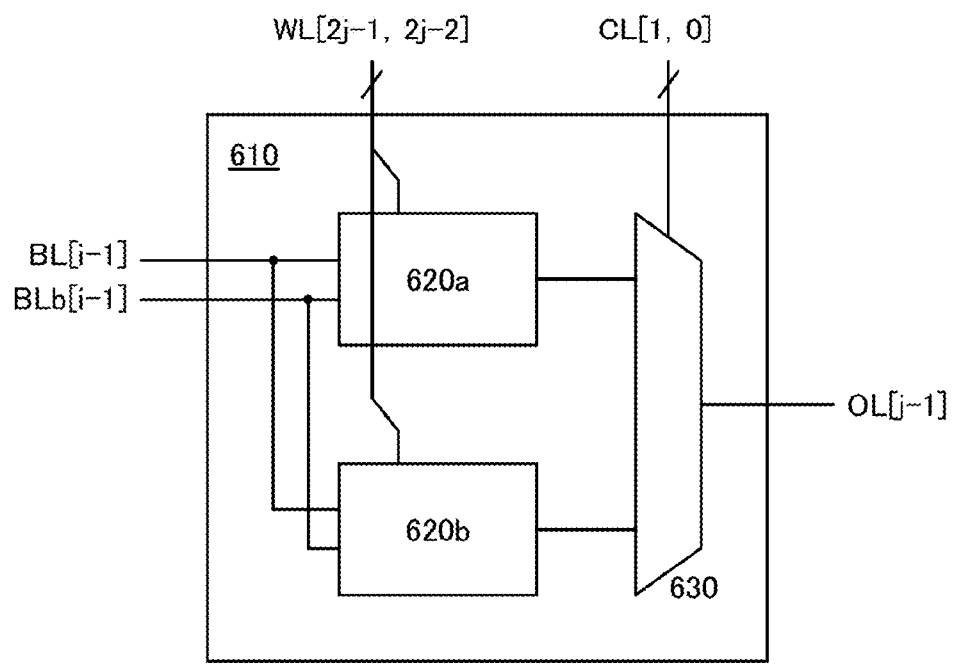
FIGS. 18A and 18B illustrate an example of a structure of a device.

FIG. 18A illustrates a specific structural example of the circuit 610 in the i-th column and the j-th row. The circuit 610 includes a plurality of circuits 620 having a function of storing data and a multiplexer 630 having a function of selecting among data output from the plurality of circuits 620. Specifically, FIG. 18A illustrates an example in which the circuit 610 includes two circuits 620 (a circuit 620a and a circuit 620b).

Specifically, a wiring BL[i−1] and a wiring BLb[i−1] to which respective signals with inverted polarities are input are both electrically connected to the circuit 620a and the circuit 620b. The wiring WL[2j−2] and the wiring WL[2j−1] are electrically connected to each of the circuit 620a and the circuit 620b. The wiring CL[0] and the wiring CL[1] are electrically connected to the multiplexer 630. Either data output from the circuit 620a or data output from the circuit 620b is selected by the multiplexer 630 in accordance with data contained in signals supplied through the wiring CL[0] and the wiring CL[1].

Note that the number of circuits 620 in the circuit 610 may be three or more. In that case, it is preferable that the numbers of wirings WL and wirings CL electrically connected to the circuit 610 be also adjusted in accordance with the number of circuits 620. The number of circuits 620 in the circuit 610 may be one. In that case, it is preferable that the numbers of wirings WL and wirings CL be also adjusted in accordance with the number of circuits 620. Furthermore, in the case where the number of circuits 620 in the circuit 610 is one, the multiplexer 630 is not necessarily provided in the circuit 610, and data output from the circuit 620 may be input to the wiring OL[j−1].

Figure 18B:
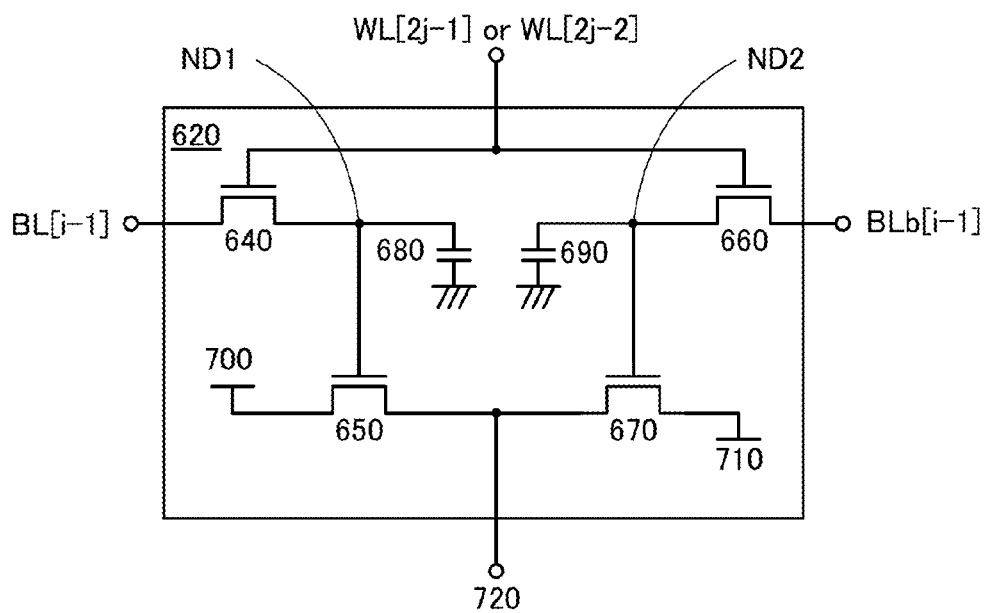

FIG. 18B illustrates a specific structure of the circuit 620 as an example. The circuit 620 in FIG. 18B includes at least transistors 640, 650, 660, and 670. The circuit 620 may include capacitors 680 and 690 as illustrated in FIG. 18B.

The transistor 640 has a function of controlling the supply of the potential of a first signal containing data to a node ND1 in the circuit 620. Specifically, when the transistor 640 is on, the potential of the first signal containing data which is supplied to the wiring BL[i−1] is supplied to the node ND1. When the transistor 640 is off, the potential of the node ND1 is held. One electrode of the capacitor 680 is electrically connected to the node ND1, and the capacitor 680 has a function of holding the potential of the node ND1. The other electrode of the capacitor 680 is connected to, for example, a wiring having a function of supplying a constant potential and is connected to, for example, a GND line. Note that the potential of the wiring is not limited to 0 V.

Whether the transistor 640 is turned on or off is selected in accordance with the potential of a signal supplied to the wiring WL[2j−1] or the wiring WL[2j−2].

The transistor 650 has a function of switching electrical connection and disconnection of a wiring 700 and a wiring 720 to and from each other in accordance with the potential of the node ND1. Specifically, when the transistor 650 is on, the wiring 700 and the wiring 720 are electrically connected to each other. When the transistor 650 is off, the wiring 700 and the wiring 720 are electrically disconnected from each other.

The transistor 660 has a function of controlling the supply of the potential of a second signal containing data to a node ND2 in the circuit 620. Specifically, when the transistor 660 is on, the potential of the second signal containing data which is supplied to the wiring BLb[i−1] is supplied to the node ND2. When the transistor 660 is off, the potential of the node ND2 is held. One electrode of the capacitor 690 is electrically connected to the node ND2, and the capacitor 690 has a function of holding the potential of the node ND2. The other electrode of the capacitor 690 is electrically connected to, for example, a wiring having a function of supplying a constant potential and is connected to, for example, a GND line. Note that the potential of the wiring is not limited to 0 V. The other electrode of the capacitor 690 may be electrically connected to the other electrode of the capacitor 680. However, one embodiment of the present invention is not limited thereto.

Whether the transistor 660 is turned on or off is selected in accordance with the potential of the signal supplied to the wiring WL[2j−1] or the wiring WL[2j−2].

The transistor 670 has a function of switching electrical connection and disconnection of a wiring 710 and the wiring 720 to and from each other in accordance with the potential of the node ND2. Specifically, when the transistor 670 is on, the wiring 710 and the wiring 720 are electrically connected to each other. When the transistor 670 is off, the wiring 710 and the wiring 720 are electrically disconnected from each other.

Note that the high-level potential VDD is applied to the wiring 700 and the low-level potential VSS is applied to the wiring 710. When data is to be written to the circuit 620, the potential of the first signal and the potential of the second signal are opposite in polarity, that is, have inverted logic levels. Thus, when one of the transistors 650 and 670 is on, the other is off. Which of the transistors 650 and 670 is on depends on the potentials of the first and second signals, that is, data. Accordingly, whether the potential applied to the wiring 720 is the high-level potential VDD or the low-level potential VSS depends on the data.

A signal containing data about the potential applied to the wiring 720 is input to the multiplexer 630 in FIG. 18A.

Note that transistors used as the transistors 640 and 660 in the circuit 620 illustrated in FIG. 18B preferably have extremely small off-state current because the transistors retain the potentials of the nodes ND1 and ND2. Transistors in which a channel formation region is formed in a film of a semiconductor having a wider band gap and lower intrinsic carrier density than silicon can have extremely small off-state current and thus are preferably used as the transistors 640 and 660. Examples of such a semiconductor are an oxide semiconductor and gallium nitride that have a band gap more than twice as wide as that of silicon. Consequently, the use of the transistors with the above structure as the transistors 640 and 660 can prevent leakage of electric charge held at the nodes ND1 and ND2.

In the case where an n-channel transistor is used as the transistor 640, it is easy to make the node ND1 have the potential VSS but it is difficult to make the node ND1 have the potential VDD in light of the threshold voltage of the transistor. For this reason, if a p-channel transistor is used as the transistor 650, it is difficult to turn off the transistor 650 completely and a shoot-through current is likely to flow through the transistor 650. Consequently, in the case where an n-channel transistor is used as the transistor 640, an n-channel transistor is preferably used as the transistor 650 in order to prevent shoot-through current. The same applies to the transistors 660 and 670. In other words, in the case where an n-channel transistor is used as the transistor 660, an n-channel transistor is preferably used as the transistor 670 in order to prevent shoot-through current.

In addition, in the case where a p-channel transistor is used as the transistor 640, it is easy to make the node ND1 have the potential VDD but it is difficult to make the node ND1 have the potential VSS in light of the threshold voltage of the transistor. For this reason, if an n-channel transistor is used as the transistor 650, it is difficult to turn off the transistor 650 completely and a shoot-through current is likely to flow through the transistor 650. Consequently, in the case where a p-channel transistor is used as the transistor 640, a p-channel transistor is preferably used as the transistor 650 in order to prevent shoot-through current. The same applies to the transistors 660 and 670. In other words, in the case where a p-channel transistor is used as the transistor 660, a p-channel transistor is preferably used as the transistor 670 in order to prevent shoot-through current.

Note that this embodiment can be implemented in appropriate combination with other embodiments.

Embodiment 5

In this embodiment, a configuration example of a reconfigurable circuit which can be used as the circuit 12 (see FIGS. 1 to 5) is described.

<Example of Cross-Sectional Structure of Semiconductor Device>

Figure 19:
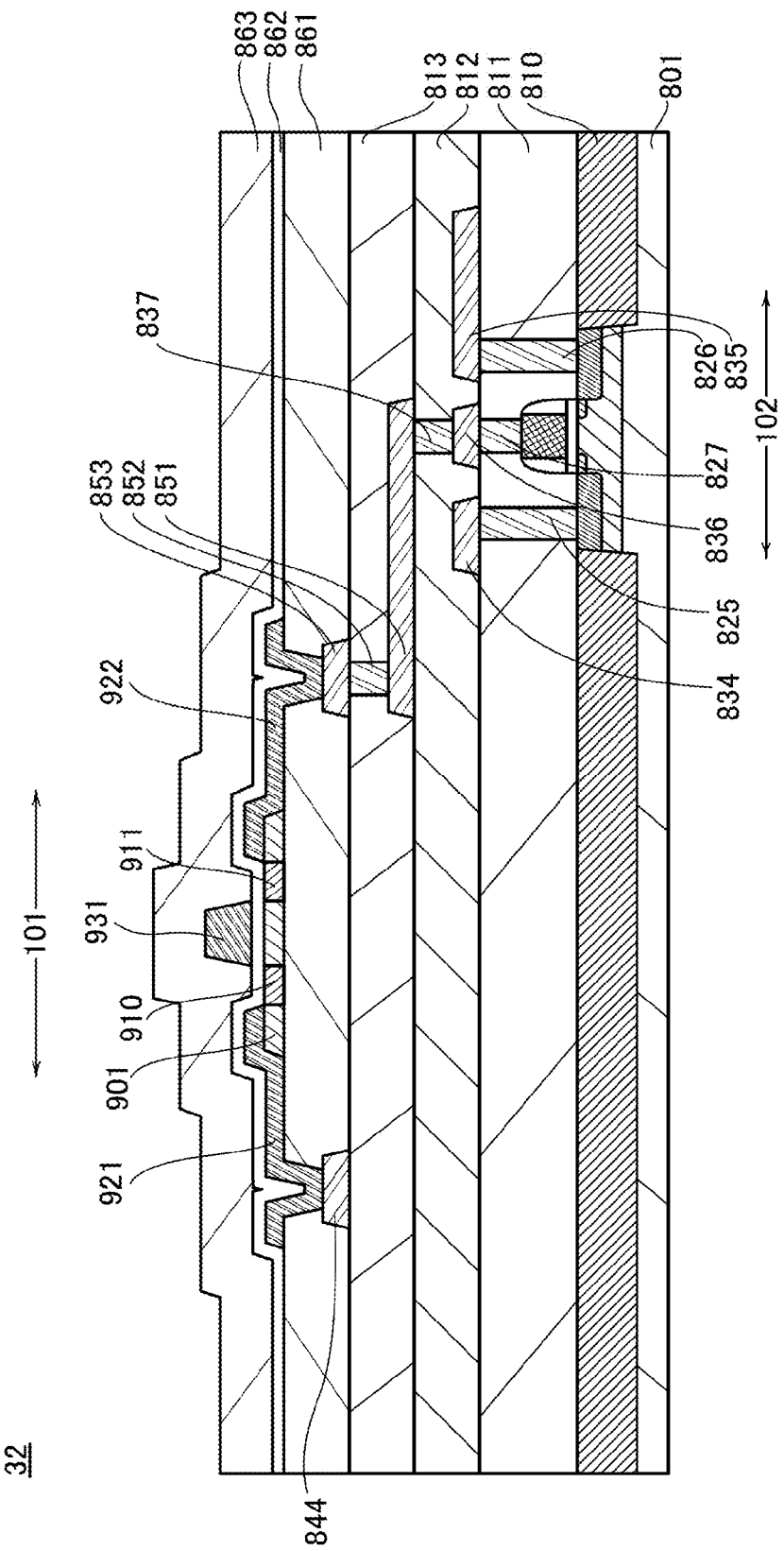
FIG. 19 illustrates an example of a structure of a transistor.

FIG. 19 illustrates an example of a cross-sectional structure of a semiconductor device including the cell 32 in FIG. 8.

Note that FIG. 19 shows an example in which the transistor 101 whose channel formation region is included in an oxide semiconductor film (hereinafter also referred to as OS transistor) is formed over the transistor 102 whose channel formation region is included in a single-crystal silicon substrate (hereinafter also referred to as Si transistor). This structure in which an OS transistor is stacked over a Si transistor can be used for the cell 32 in FIGS. 8 and 9 appropriately. For example, Si transistors are formed as the p-channel transistors 102, 103, 115, and 116 in FIGS. 8 and 9 over a single-crystal silicon substrate like the transistor 102 in FIG. 19, and OS transistors are formed as the n-channel transistors 101, 114, and 116 in FIGS. 8 and 9 over the transistors over the single-crystal silicon substrate like the transistor 101 in FIG. 19.

The transistor 102 may include the channel formation region in a semiconductor film or a semiconductor substrate of silicon, germanium, or the like in an amorphous, microcrystalline, polycrystalline, or single crystal state. Alternatively, the transistor 102 may include the channel formation region in an oxide semiconductor film or an oxide semiconductor substrate. In the case where the transistors each include a channel formation region in an oxide semiconductor film or an oxide semiconductor substrate, the transistor 101 is not necessarily stacked over the transistor 102, and the transistors 101 and 102 may be formed in the same layer.

In the case where the transistor 102 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 801 where the transistor 102 is formed can be, for example, a silicon substrate, a germanium substrate, or a silicon germanium substrate. In FIG. 19, a single crystal silicon substrate is used as the semiconductor substrate 801.

The transistor 102 is electrically isolated by an element isolation method. As the element isolation method, a selective oxidation method (a local oxidation of silicon (LOCOS) method), a trench isolation method (a shallow trench isolation (STI) method), or the like can be used. FIG. 19 illustrates an example where the trench isolation method is used to electrically isolate the transistor 102. Specifically, in FIG. 19, the transistor 102 is electrically isolated by element isolation using an element isolation region 810 formed in such a manner that an insulator including silicon oxide or the like is buried in a trench formed in the semiconductor substrate 801 by etching or the like.

An insulating film 811 is provided over the transistor 102. Openings are formed in the insulating film 811. Conductive films 825 and 826 that are electrically connected to the source and the drain of the transistor 102 and a conductive film 827 that is electrically connected to the gate of the transistor 102 are formed in the openings.

The conductive film 825 is electrically connected to a conductive film 834 formed over the insulating film 811. The conductive film 826 is electrically connected to a conductive film 835 formed over the insulating film 811. The conductive film 827 is electrically connected to a conductive film 836 formed over the insulating film 811.

An insulating film 812 is formed over the conductive films 834 to 836. An opening is formed in the insulating film 812. A conductive film 837 electrically connected to the conductive film 836 is formed in the opening. The conductive film 837 is electrically connected to a conductive film 851 formed over the insulating film 812.

An insulating film 813 is formed over the conductive film 851. An opening is formed in the insulating film 813. A conductive film 852 electrically connected to the conductive film 851 is formed in the opening. The conductive film 852 is electrically connected to a conductive film 853 formed over the insulating film 813. A conductive film 844 is formed over the insulating film 813.

An insulating film 861 is formed over the conductive film 853 and the conductive film 844. In FIG. 19, the transistor 101 is formed over the insulating film 861.

The transistor 101 includes, over the insulating film 861, a semiconductor film 901 including an oxide semiconductor, conductive films 921 and 922 functioning as source and drain electrodes over the semiconductor film 901, a gate insulating film 862 over the semiconductor film 901 and the conductive films 921 and 922, and a gate electrode 931 overlapping with the semiconductor film 901 over the gate insulating film 862 and between the conductive films 921 and 922. Note that the conductive film 922 is electrically connected to the conductive film 853 in the opening formed in the insulating film 861.

In the semiconductor film 901 of the transistor 101, there is a region 910 between a region overlapping with the conductive film 921 and a region overlapping with the gate electrode 931. In addition, in the semiconductor film 901 of the transistor 101, there is a region 911 between a region overlapping with the conductive film 922 and the region overlapping with the gate electrode 931. When argon, an impurity which imparts p-type conductivity to the semiconductor film 901, or an impurity which imparts n-type conductivity to the semiconductor film 901 is added to the regions 910 and 911 using the conductive films 921 and 922 and the gate electrode 931 as a mask, the resistivity of the regions 910 and 911 can be made lower than that of the region overlapping with the gate electrode 931 in the semiconductor film 901.

An insulating film 863 is provided over the transistor 101.

In FIG. 19, the transistor 101 has the gate electrode 931 on at least one side of the semiconductor film 901; alternatively, the transistor 101 may have a pair of gate electrodes with the semiconductor film 901 positioned therebetween.

In the case where the transistor 101 has a pair of gate electrodes with the semiconductor film 901 positioned therebetween, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 19, the transistor 101 has a single-gate structure where one channel formation region corresponding to one gate electrode 931 is provided. However, the transistor 101 may have a multi-gate structure where a plurality of electrically connected gate electrodes are provided so that a plurality of channel formation regions are included in one active layer.

<Transistor>

Next, an example of a structure of a transistor 90 that includes a channel formation region in an oxide semiconductor film is described.

Figure 20A:
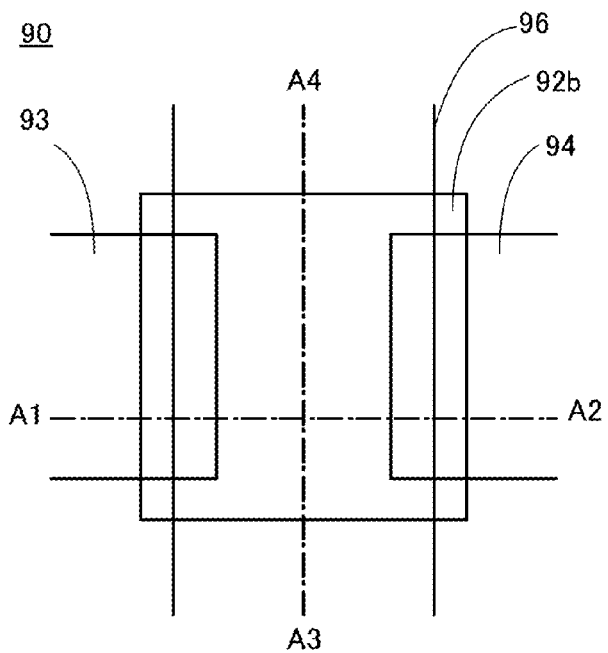
FIGS. 20A to 20C illustrate an example of a structure of a transistor.
Figure 20C:
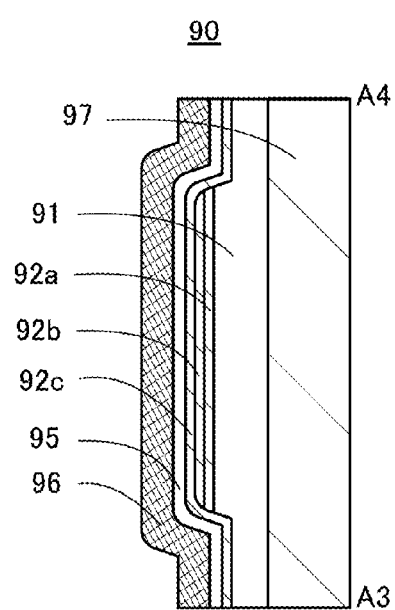
Figure 20B:
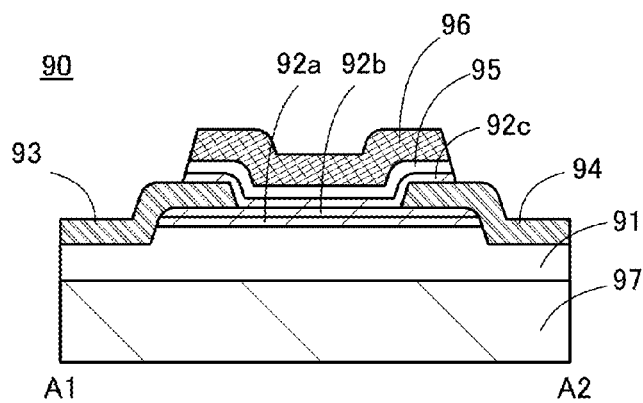

FIGS. 20A to 20C illustrate a structure of the transistor 90 that includes a channel formation region in an oxide semiconductor film as an example. FIG. 20A is a top view of the transistor 90. Note that insulating films are not illustrated in FIG. 20A in order to clarify the layout of the transistor 90. FIG. 20B is a cross-sectional view along the dashed line A1-A2 in the top view in FIG. 20A. FIG. 20C is a cross-sectional view along the dashed line A3-A4 in the top view in FIG. 20A.

As illustrated in FIGS. 20A to 20C, the transistor 90 includes an oxide semiconductor film 92a and an oxide semiconductor film 92b that are stacked in this order over an insulating film 91 formed over a substrate 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor films 92a to 92c. Note that the substrate 97 may be a glass substrate, a semiconductor substrate, or the like or may be an element substrate where semiconductor elements are formed over a glass substrate or on a semiconductor substrate.

Figure 21A:
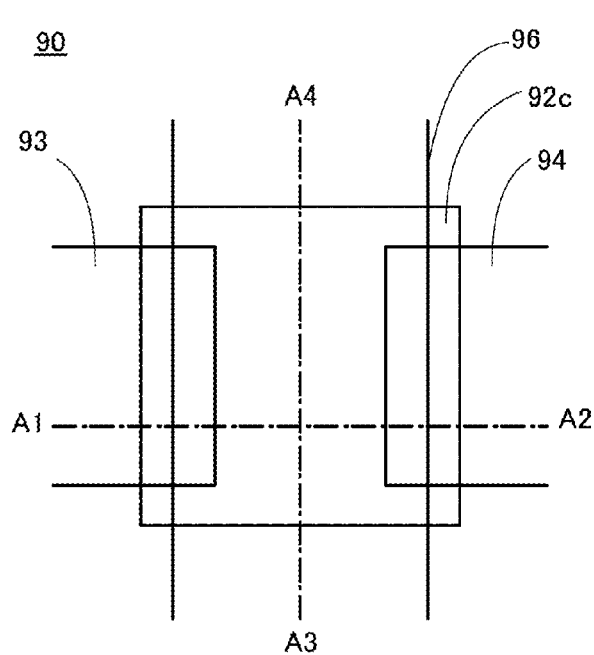
FIGS. 21A to 21C illustrate an example of a structure of a transistor.
Figure 21C:
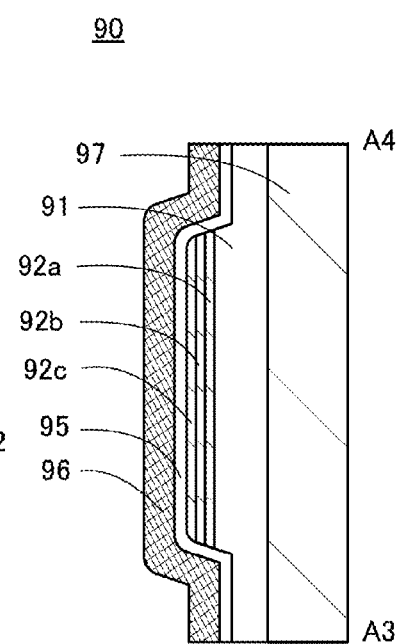
Figure 21B:
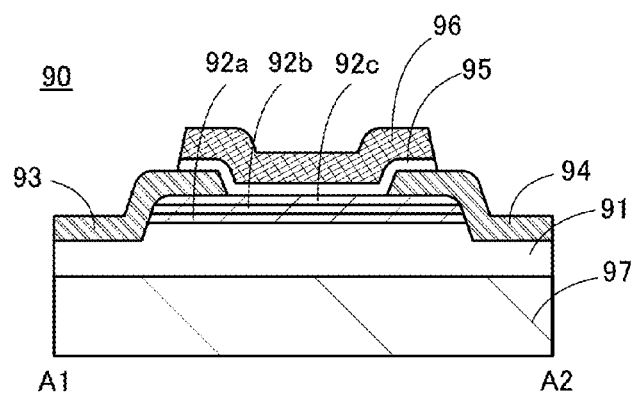

FIGS. 21A to 21C illustrate another specific example of the structure of the transistor 90. FIG. 21A is a top view of the transistor 90. Note that insulating films are not illustrated in FIG. 21A in order to clarify the layout of the transistor 90. FIG. 21B is a cross-sectional view along the dashed line A1-A2 in the top view in FIG. 21A. FIG. 21C is a cross-sectional view along the dashed line A3-A4 in the top view in FIG. 21A.

As illustrated in FIGS. 21A to 21C, the transistor 90 includes the oxide semiconductor films 92a to 92c that are stacked in this order over the insulating film 91; the conductive films 93 and 94 that are electrically connected to the oxide semiconductor film 92c and function as a source electrode and a drain electrode; the insulating film 95 that functions as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

FIGS. 20A to 20C and FIGS. 21A to 21C each illustrate the structure example of the transistor 90 in which the oxide semiconductor films 92a to 92c are stacked. However, the structure of the oxide semiconductor film included in the transistor 90 is not limited to a stacked-layer structure including a plurality of oxide semiconductor films and may be a single-layer structure.

In the case where the transistor 90 includes the semiconductor film in which the semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at an interface between the oxide semiconductor films 92b and 92a, a channel region is also formed in a region close to the interface; thus, the threshold voltage of the transistor 90 varies. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure can reduce variations in electrical characteristics of the transistor 90, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5\times10^{-7}$ Pa to $1\times10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1 and In:M:Zn=3:1:2.

Specifically, in the case where the oxide semiconductor film 92a and the oxide semiconductor film 92c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 92a and 92c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, in which case the transistor 90 can have stable electrical characteristics.

Note that a channel formation region refers to a region of a semiconductor film of the transistor 90 that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

When the oxide semiconductor film 92b is a CAAC-OS film, the oxide semiconductor film 92b is preferably deposited with the use of a polycrystalline In—Ga—Zn oxide containing In, Ga, and Zn in an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW. When the oxide semiconductor film 92b is a CAAC-OS film, the oxide semiconductor film 92b may be deposited with the use of an In—Ga—Zn oxide target with an atomic ratio of 2:1:3. In the CAAC-OS film deposited with the use of the target, the proportion of a region where a diffraction pattern of the CAAC-OS film is observed in a predetermined area (also referred to as proportion of CAAC) can be high. As a result, the frequency characteristics of a transistor including a channel formation region in the CAAC-OS film can be high.

The oxide semiconductor films 92a to 92c can be formed by a sputtering method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

The carrier density in a highly purified oxide semiconductor film is decreased by reducing an impurity element. The carrier density can be, for example, $1 \times 10^{17}/cm^3$ or less, $1 \times 10^{15}/cm^3$ or less, $1 \times 10^{13}/cm^3$ or less, or $8 \times 10^{11}/cm^3$ or less. The carrier density of the film is lower than $8 \times 10^{11}/cm^3$, preferably lower than $1 \times 10^{11}/cm^3$, further preferably lower than $1 \times 10^{10}/cm^3$ and can be $1 \times 10^{-9}/cm^3$ or higher.

Specifically, various experiments can prove a small off-state current of a transistor having a channel formation region in a highly purified oxide semiconductor film. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In that case, it can be seen that off-state current of the transistor normalized on the channel width is lower than or equal to 100 zA/μm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charges of the capacitor per unit time. As a result, it can be seen that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

Next, heat treatment is preferably performed to reduce impurities such as moisture and hydrogen contained in the oxide semiconductor film and to purify the oxide semiconductor film.

For example, the oxide semiconductor film is subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

Note that the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment may be performed at any time after the oxide semiconductor film is formed. For example, the heat treatment may be performed after the oxide semiconductor film is selectively etched.

The heat treatment may be performed at a temperature higher than or equal to 250° C. and lower than or equal to 650° C., preferably higher than or equal to 300° C. and lower than or equal to 500° C. The treatment time is shorter than or equal to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

In the transistor 90, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. Examples of such a conductive material include Al, Cr, Cu, Ta, Ti, Mo, and W.

Furthermore, in the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 90 illustrated in FIGS. 20A to 20C or FIGS. 21A to 21C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, it can be considered that, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 90 illustrated in FIGS. 20A to 20C or FIGS. 21A to 21C. Consequently, current that flows between the conductive films 93 and 94 through the end portions of the oxide semiconductor film 92b can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, in the transistor 90, even when the distance between the conductive films 93 and 94 at the end portions of the oxide semiconductor film 92b is reduced as a result of reducing the channel length to obtain high on-state current, the transistor 90 can have low off-state current. Consequently, with the short channel length, the transistor 90 can have high on-state current when in an on state and low off-state current when in an off state.

With the s-channel structure, specifically, when a potential at which the transistor 90 is turned on is supplied to the conductive film 96, the amount of current that flows between the conductive films 93 and 94 through the end portions of the oxide semiconductor film 92b can be increased. The current contributes to an increase in the field-effect mobility and an increase in the on-state current of the transistor 90. When the end portions of the oxide semiconductor film 92b overlap with the conductive film 96, carriers flow in a wide region of the oxide semiconductor film 92b without being limited to a region in the vicinity of the interface between the oxide semiconductor film 92b and the insulating film 95, which results in an increase in the amount of carrier movement in the transistor 90. As a result, the on-state current of the transistor 90 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is the apparent field-effect mobility in a saturation region of the transistor, which is an index of current drive capability.

A structure of an oxide semiconductor film is described below. In the following description, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°. The trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

<CAAC-OS Film>

First, a CAAC-OS film is described.

The CAAC-OS film is an oxide semiconductor film including a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, such a surface is referred to as a formation surface) or a top surface of the CAAC-OS film, and is arranged parallel to the formation surface or the top surface of the CAAC-OS film.

In contrast, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

FIG. 24A is a cross-sectional TEM image of a CAAC-OS film. FIG. 24B is a cross-sectional TEM image obtained by enlarging the image of FIG. 24A. In FIG. 24B, atomic arrangement is highlighted for easy understanding.

FIG. 24C is Fourier transform images of regions each surrounded by a circle (the diameter is approximately 4 nm) between A and O and between O and A' in FIG. 24A. C-axis alignment can be observed in each region in FIG. 24C. The c-axis direction between A and O is different from that between O and A', which indicates that a grain in the region between A and O is different from that between O and A'. In addition, between A and O, the angle of the c-axis continuously and gradually changes from 14.3°, 16.6°, to 30.9°. Similarly, between O and A', the angle of the c-axis continuously changes from −18.3°, −17.6°, to −11.3°.

Figure 25A:
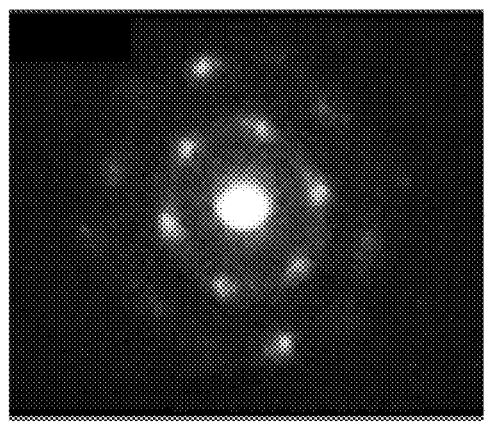
FIGS. 25A to 25D each illustrate an example of a structure of an oxide semiconductor.

Note that in an electron diffraction pattern of the CAAC-OS film, spots (luminescent spots) having alignment are shown. For example, spots are observed in an electron diffraction pattern (also referred to as a nanobeam electron diffraction pattern) of the top surface of the CAAC-OS film which is obtained using an electron beam with a diameter of, for example, larger than or equal to 1 nm and smaller than or equal to 30 nm (see FIG. 25A).

From the results of the cross-sectional TEM image and the plan-view TEM image, alignment is found in the crystal parts in the CAAC-OS film.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 nm$^2$, larger than or equal to 5 μm$^2$, or larger than or equal to 1000 μm$^2$ is observed in some cases in the plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray beam is incident on a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added may be changed, and the degree of crystallinity in the CAAC-OS film might vary depending on regions.

Note that when the CAAC-OS film with an InGaZnO$_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

In a transistor including the CAAC-OS film, changes in electrical characteristics of the transistor due to irradiation with visible light or ultraviolet light are small.

<Microcrystalline Oxide Semiconductor Film>

Next, a microcrystalline oxide semiconductor film is described. In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a crystal grain boundary cannot be found clearly in some cases.

Figure 25B:
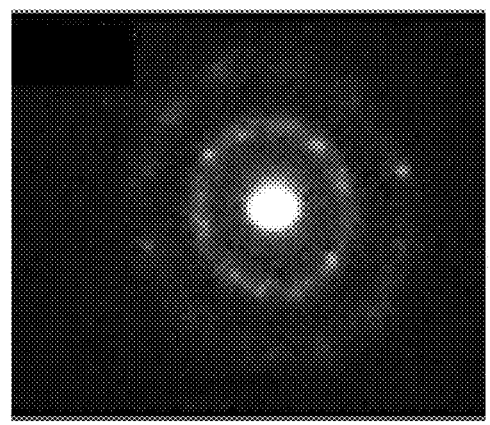

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 25B).

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

However, even when the oxide semiconductor film is a CAAC-OS film, a diffraction pattern that is partly similar to that of an nc-OS film is observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 25C:
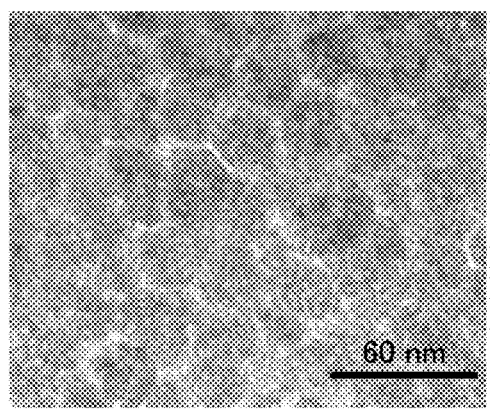
Figure 25D:
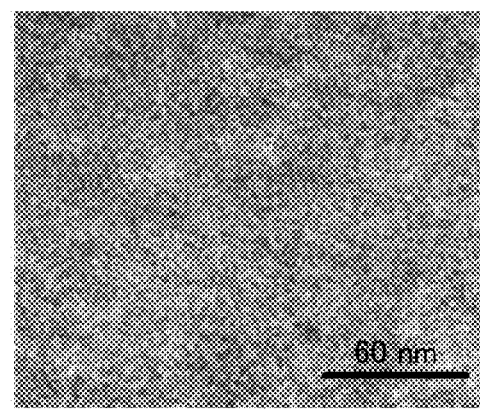

FIGS. 25C and 25D are plan-view TEM images of the CAAC-OS film obtained just after the deposition (as-sputtered) and the CAAC-OS film subjected to the heat treatment at 450° C., respectively. Comparison between FIGS. 25C and 25D shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Embodiment 6

In this embodiment, a structure example of a semiconductor device including a cell 32 different from FIG. 19 is described.

<Example of Cross-Sectional Structure of Semiconductor Device>

Figure 22:
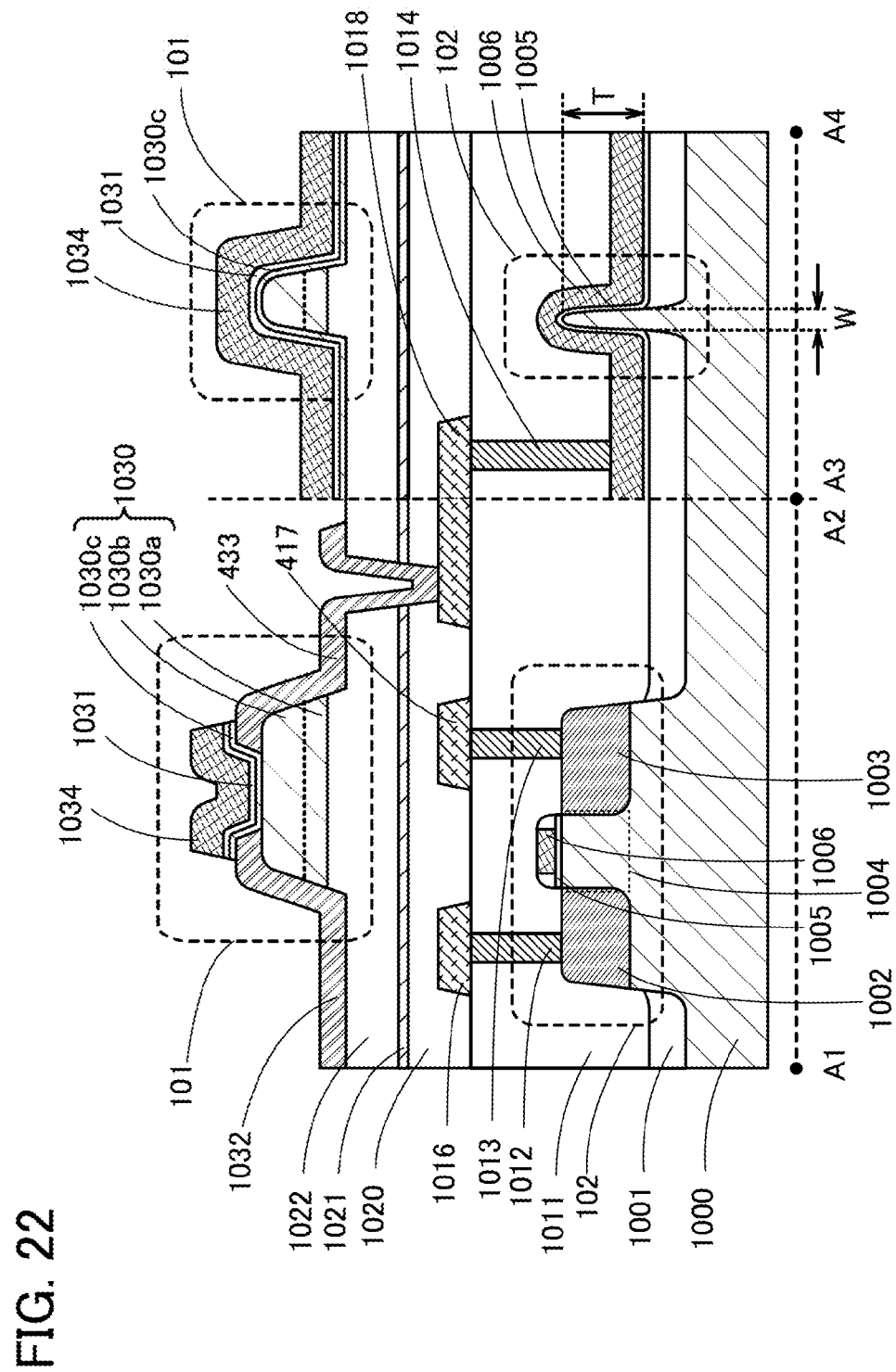
FIG. 22 illustrates an example of a structure of transistors.

FIG. 22 illustrates an example of a cross-sectional structure of a semiconductor device including the circuit 13 in FIGS. 8A and 8B. A region along dashed line A1-A2 shows a structure of the transistors 102 and 101 in the channel length direction, and a region along dashed line A3-A4 shows a structure of the transistors 102 and 101 in the channel width direction. Note that in one embodiment of the present invention, the channel length direction of the transistor 102 is not necessarily aligned with the channel length direction of the transistor 101.

The channel length direction refers to a direction substantially parallel to a direction in which a carrier moves in the transistor, and the channel width direction refers to a direction perpendicular to the channel length direction in a plane parallel to a substrate.

In FIG. 22, the transistor 101 including a channel formation region in an oxide semiconductor film is formed over the transistor 102 including a channel formation region in a single crystal silicon substrate. This structure in which an OS transistor is stacked over a Si transistor can be used for the cell 32 in FIGS. 8 and 9 appropriately. For example, Si transistors are formed as the p-channel transistors 102, 103, 115, and 116 in FIGS. 8 and 9 over a single-crystal silicon substrate like the transistor 102 in FIG. 19, and OS transistors are formed as the n-channel transistors 101, 114, and 116 in FIGS. 8 and 9 over the transistors over the single-crystal silicon substrate like the transistor 101 in FIG. 19.

The transistor 102 may include the channel formation region in a semiconductor film or a semiconductor substrate of silicon, germanium, or the like in an amorphous, microcrystalline, polycrystalline, or single crystal state. Alternatively, the transistor 102 may include the channel formation region in an oxide semiconductor film or an oxide semiconductor substrate. In the case where the transistors each include a channel formation region in an oxide semiconductor film or an oxide semiconductor substrate, the transistor 101 is not necessarily stacked over the transistor 102, and the transistors 101 and 102 may be formed in the same layer.

In the case where the transistor 102 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 1000 where the transistor 102 is formed can be, for example, a silicon substrate, a germanium substrate, or a silicon germanium substrate. In FIG. 22, a single crystal silicon substrate is used as the substrate 1000.

The transistor 102 is electrically isolated by an element isolation method. As the element isolation method, a trench isolation method (a shallow trench isolation (STI) method) or the like can be used. FIG. 22 illustrates an example where the trench isolation method is used to electrically isolate the transistor 102. Specifically, in FIG. 22, the transistor 102 is electrically isolated by element isolation using an element isolation region 1001 formed in such a manner that an insulator including silicon oxide or the like is buried in a trench formed in the substrate 1000 by etching or the like and then the insulator is removed partly by etching or the like.

In a projection of the substrate 1000 that exists in a region other than the trench, an impurity region 1002 and an impurity region 1003 of the transistor 102 and a channel formation region 1004 placed between the impurity regions 1002 and 1003 are provided. Further, the transistor 102 includes an insulating film 1005 covering the channel formation region 1004 and a gate electrode 1006 that overlaps with the channel formation region 1004 with the insulating film 1005 provided therebetween.

In the transistor 102, a side portion and an upper portion of the projection in the channel formation region 1004 overlap with the gate electrode 1006 with the insulating film 1005 positioned therebetween, so that carriers flow in a wide area including the side portion and the upper portion of the channel formation region 1004. Therefore, an area over the substrate occupied by the transistor 102 can be reduced, and the number of transferred carriers in the transistor 102 can be increased. As a result, the on-state current and field-effect mobility of the transistor 102 are increased. Suppose the length in the channel width direction (channel width) of the projection in the channel formation region 1004 is W, and the thickness of the projection in the channel formation region 1004 is T. When the aspect ratio of the thickness T to the channel width W is high, a region where carriers flow becomes larger. Thus, the on-state current of the transistor 102 can be further increased and the field-effect mobility of the transistor 102 can be further increased.

Note that when the transistor 102 is formed using a bulk semiconductor substrate, the aspect ratio is preferably 0.5 or more, further preferably 1 or more.

An insulating film 1011 is provided over the transistor 102. Openings are formed in the insulating film 1011. Conductive films 1012 and 1013 that are electrically connected to the impurity regions 1002 and 1003, respectively, and a conductive film 1014 that is electrically connected to the gate electrode 1006 are formed in the openings.

The conductive film 1012 is electrically connected to a conductive film 1016 formed over the insulating film 1011. The conductive film 1013 is electrically connected to a conductive film 1017 formed over the insulating film 1011. The conductive film 1014 is electrically connected to a conductive film 1018 formed over the insulating film 1011.

An insulating film 1020 is provided over the conductive films 1016 to 1018. An insulating film 1021 having a blocking effect of preventing diffusion of oxygen, hydrogen, and water is provided over the insulating film 1020. As the insulating film 1021 has higher density and becomes denser or has a fewer dangling bonds and becomes more chemically stable, the insulating film 1021 has a higher blocking effect. The insulating film 1021 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 1021 having an effect of blocking diffusion of hydrogen and water can be formed using, for example, silicon nitride or silicon nitride oxide.

An insulating film 1022 is provided over the insulating film 1021, and the transistor 101 is provided over the insulating film 1022.

The transistor 101 includes, over the insulating film 1022, a semiconductor film 1030 including an oxide semiconductor, conductive films 1032 and 1033 functioning as source and drain electrodes and electrically connected to the semiconductor film 1030, a gate insulating film 1031 covering the semiconductor film 1030, and a gate electrode 1034 overlapping with the semiconductor film 1030 with the gate insulating film 1031 positioned therebetween. Note that an opening is formed in the insulating films 1020 to 1022. The conductive film 1033 is connected to the conductive film 1018 in the opening.

Note that in FIG. 22, the transistor 101 includes at least the gate electrode 1034 on one side of the semiconductor film 1030, and may further include a gate electrode overlapping with the semiconductor film 1030 with the insulating film 1022 positioned therebetween.

In the case where the transistor 101 has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 22, the transistor 12 has a single-gate structure where one channel formation region corresponding to one gate electrode 1034 is provided. However, the transistor 12 may have a multi-gate structure where a plurality of electrically connected gate electrodes are provided so that a plurality of channel formation regions are included in one active layer.

FIG. 22 illustrates an example in which the semiconductor film 1030 included in the transistor 101 includes oxide semiconductor films 1030a to 1030c that are stacked in this order over the insulating film 1022. Note that in one embodiment of the present invention, the semiconductor film 1030 of the transistor 101 may be formed using a single-layer metal oxide film.

Note that this embodiment can be implemented in appropriate combination with other embodiments.

Embodiment 7

Although the variety of films such as the conductive films, the semiconductor films, and the insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive film, the semiconductor film, and the inorganic insulating film which have been disclosed in the embodiments can be formed by a thermal CVD method such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

The structure described in this embodiment can be used in appropriate combination with any of the structures described in the other embodiments.

Embodiment 8

Examples of Electronic Device

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 23A to 23F illustrate specific examples of these electronic devices.

Figure 23A:
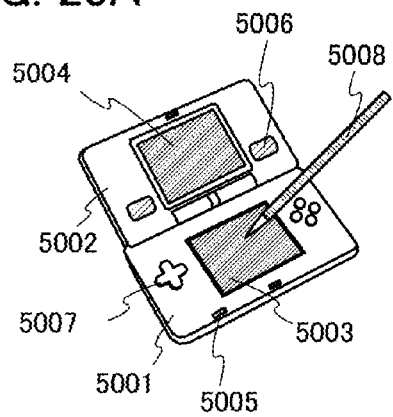
FIGS. 23A to 23F illustrate electronic appliances.

FIG. 23A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 23A has the two display portions 5003 and 5004, the number of display portions included in a portable game machine is not limited to this.

Figure 23B:
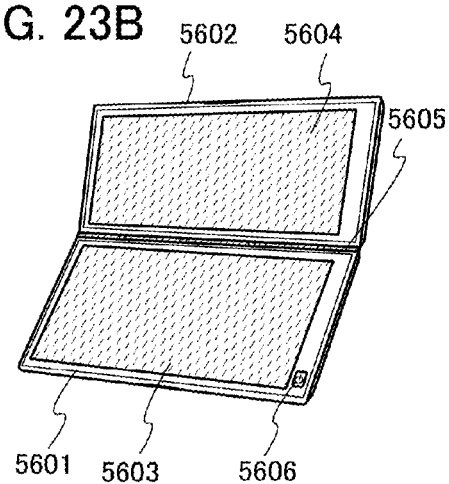

FIG. 23B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 23C:
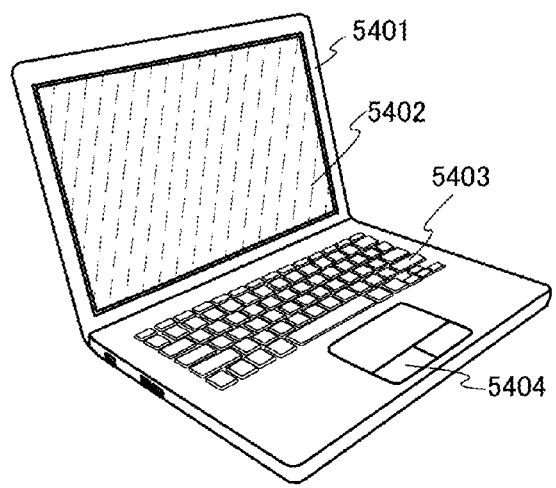

FIG. 23C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 23D:
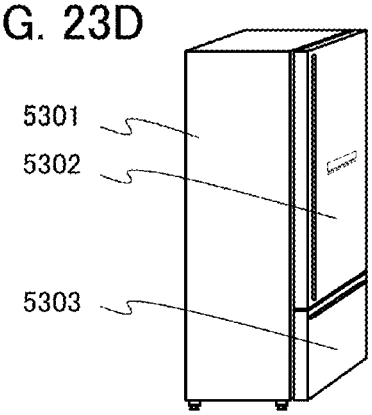

FIG. 23D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 23E:
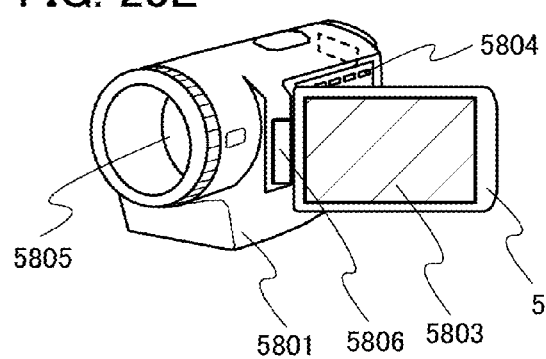

FIG. 23E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 23F:
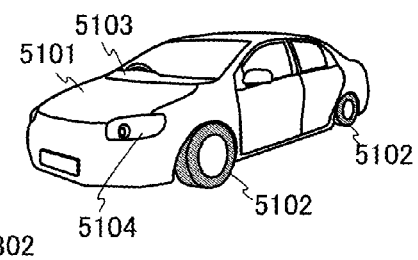

FIG. 23F illustrates a passenger car including a car body 5101, wheels 5102, a dashboard 5103, lights 5104, and the like. The semiconductor device of one embodiment of the present invention can be used for a variety of integrated circuits included in passenger cars.

For example, in this specification and the like, an explicit description "X and Y are connected" means that X and Y are electrically connected, X and Y are functionally connected, and X and Y are directly connected. Accordingly, without limiting to a predetermined connection relation, for example, a connection relation shown in drawings and texts, another element may be interposed between elements having the connection relation shown in the drawings and the texts.

Here, X and Y each denote an object (e.g., a device, an element, a circuit, a wiring, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up converter, or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit expression "X and Y are electrically connected" is the same as the explicit simple expression "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, Z2 each denote an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed and part of the range is removed, whereby one embodiment of the invention can be constituted excluding part of the range can be constructed. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, the description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, the description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, the description "a film is an insulating film" is given to describe a property of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a layered film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the embodiment of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it may be possible for those skilled in the art to constitute one embodiment of the invention even when portions to which all the terminals of an active element (e.g., a transistor or a diode), a passive element (e.g., a capacitor or a resistor), are the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear. Moreover, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out M layers (M is an integer, where M<N) from a cross-sectional view in which N layers (N is an integer) are provided and constitute one embodiment of the invention. For another example, it is possible to take out M elements (M is an integer, where M<N) from a flow chart in which N elements (N is an integer) are provided and constitute one embodiment of the invention. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, what is illustrated in at least a diagram (which may be part of the diagram) is disclosed as one embodiment of the invention, and one embodiment of the invention can be constituted.

Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

This application is based on Japanese Patent Application serial no. 2014-022542 filed with Japan Patent Office on Feb. 7, 2014, the entire contents of which are hereby incorporated by reference.

What is claimed is:

1. A device comprising:
a first circuit; and
a second circuit comprising:
a plurality of third circuits;
a plurality of fourth circuits; and
a fifth circuit,
wherein the second circuit is configured to generate a signal for testing operation of the first circuit and configured to operate as a memory of the first circuit,
wherein each of the plurality of fourth circuits comprises a first inverter and a second inverter, the second inverter comprising an input terminal electrically connected to an output terminal of the first inverter and an output terminal electrically connected to an input terminal of the first inverter,
wherein each of the plurality of fourth circuit is configured to store a first data and configured to store a second data,
wherein the fifth circuit is configured to write the first data to the plurality of fourth circuits,
wherein the fifth circuit is configured to write the second data to the plurality of fourth circuits and read the second data from the plurality of fourth circuits,
wherein the first data is to control conduction between the plurality of third circuits,
wherein each of the plurality of fourth circuits comprises a first transistor and a second transistor,
wherein one of a source and a drain of the first transistor and a gate of the second transistor are electrically connected to the input terminal of the first inverter, and
wherein the first transistor includes a first channel formation region in an oxide semiconductor layer.

2. The device according to claim 1,
wherein the second circuit is configured to operate as a cache memory of the first circuit.

3. The device according to claim 1,
wherein the first data is generated in accordance with serial data input to the fifth circuit.

4. The device according to claim 1,
wherein the second data is generated in accordance with parallel data input to the fifth circuit.

5. The device according to claim 1,
wherein the second transistor includes a second channel formation region comprising silicon.

6. The device according to claim 1,
wherein the oxide semiconductor layer comprises indium, gallium, and zinc.

7. The device according to claim 6,
wherein the oxide semiconductor layer is a CAAC-OS film.

8. The device according to claim 1, wherein each of the plurality of third circuits is configured to store the first data to change a circuit configuration of the plurality of third circuits.

9. A device comprising:
a first circuit; and
a second circuit comprising:
a plurality of third circuits;
a plurality of fourth circuits; and
a fifth circuit,
wherein the second circuit is configured to generate a signal for testing operation of the first circuit in a first period and configured to operate as a memory of the first circuit in a second period,
wherein each of the plurality of fourth circuits comprises a first inverter and a second inverter, the second inverter comprising an input terminal electrically connected to an output terminal of the first inverter and an output terminal electrically connected to an input terminal of the first inverter,
wherein each of the plurality of fourth circuits is configured to store a first data and configured to store a second data,
wherein the fifth circuit is configured to write the first data to the plurality of fourth circuits in the first period,
wherein the fifth circuit is configured to write the second data to the plurality of fourth circuits and read the second data from the plurality of fourth circuits in the second period,
wherein the first data is to control conduction between the plurality of third circuits,
wherein the first period is a period of an operation test of the first circuit,
wherein each of the plurality of fourth circuits comprises a first transistor and a second transistor,
wherein one of a source and a drain of the first transistor and a gate of the second transistor are electrically connected to the input terminal of the first inverter, and
wherein the first transistor includes a first channel formation region in an oxide semiconductor layer.

10. The device according to claim 9,
wherein the second circuit is configured to operate as a cache memory of the first circuit in the second period.

11. The device according to claim 9,
wherein the first data is generated in accordance with serial data input to the fifth circuit.

12. The device according to claim 9,
wherein the second data is generated in accordance with parallel data input to the fifth circuit.

13. The device according to claim 9,
wherein the second transistor includes a second channel formation region comprising silicon.

14. The device according to claim 9,
wherein the oxide semiconductor layer comprises indium, gallium, and zinc.

15. The device according to claim 14,
wherein the oxide semiconductor layer is a CAAC-OS film.

16. The device according to claim 9, wherein each of the plurality of third circuits is configured to store the first data to change a circuit configuration of the plurality of third circuits.

* * * * *